US011499095B2

(12) United States Patent
Yang et al.

(10) Patent No.: US 11,499,095 B2
(45) Date of Patent: Nov. 15, 2022

(54) QUANTUM DOT, PREPARATION METHOD THEREFOR AND USE THEREOF

(71) Applicant: TCL TECHNOLOGY GROUP CORPORATION, Huizhou (CN)

(72) Inventors: Yixing Yang, Huizhou (CN); Lei Qian, Huizhou (CN); Chengyu Yang, Huizhou (CN); Jielong Qiu, Huizhou (CN); Zhiwen Nie, Huizhou (CN)

(73) Assignee: TCL TECHNOLOGY GROUP CORPORATION, Huizhou (CN)

(*) Notice: Subject to any disclaimer, the term of this patent is extended or adjusted under 35 U.S.C. 154(b) by 227 days.

(21) Appl. No.: 16/954,972

(22) PCT Filed: Dec. 25, 2018

(86) PCT No.: PCT/CN2018/123592
§ 371 (c)(1),
(2) Date: Jun. 17, 2020

(87) PCT Pub. No.: WO2019/129005
PCT Pub. Date: Jul. 4, 2019

(65) Prior Publication Data
US 2020/0377791 A1 Dec. 3, 2020

(30) Foreign Application Priority Data

Dec. 29, 2017 (CN) .......................... 201711475503.4
Dec. 29, 2017 (CN) .......................... 201711475507.2
(Continued)

(51) Int. Cl.
C09K 11/88 (2006.01)
C09K 11/08 (2006.01)
(Continued)

(52) U.S. Cl.
CPC ........ *C09K 11/883* (2013.01); *C09K 11/0883* (2013.01); *C09K 11/565* (2013.01);
(Continued)

(58) Field of Classification Search
CPC ... C09K 11/02; C09K 11/0883; C09K 11/565; C09K 11/623; C09K 11/70; C09K 11/703; C09K 11/883; H01L 51/502
See application file for complete search history.

(56) References Cited

U.S. PATENT DOCUMENTS 9,340,726 B2    5/2016  Peng et al.
2010/0159248 A1* 6/2010  Jang ................ H05B 33/14
                                          977/774
(Continued)

FOREIGN PATENT DOCUMENTS

CN    106479482 A    3/2017
CN    106590633 A    4/2017
(Continued)

OTHER PUBLICATIONS

Zhong X et al: "Composition-Tunable ZnxCdI—xSe Nanocrystals with High Luminescence and Stability", Journal of the American Chemical Society, American Chemical Society, US, vol. 125, Jun. 1, 2003, pp. 8589-8594.
(Continued)

*Primary Examiner* — Allan R Wilson
(74) *Attorney, Agent, or Firm* — Anova Law Group, PLLC

(57) ABSTRACT

A quantum dot and its preparation method and application. The method includes the steps of forming a compound quantum dot core first, then adding a precursor of a metal element $M^2$ to be alloyed into the reaction system containing the compound quantum dot core. The metal element $M^2$ undergoes cation exchange with a metal element $M^1$ in the
(Continued)

existing compound quantum dot core, thereby forming a quantum dot with an alloy core. In this method, the distribution of alloyed components is not only adjusted by changing the feeding ratio of the metal elements and the non-metal elements, but also by a more real-time, more direct, and more precise adjustments through various reaction condition parameters of the actual reaction process, thereby achieving a more precise composition and energy level distribution control for alloyed quantum dots.

28 Claims, 9 Drawing Sheets

(30) Foreign Application Priority Data

| Dec. 29, 2017 | (CN) | 201711479962.X |
|---|---|---|
| Dec. 29, 2017 | (CN) | 201711479963.4 |
| Dec. 29, 2017 | (CN) | 201711484247.5 |

(51) Int. Cl.

| C09K 11/56 | (2006.01) |
|---|---|
| C09K 11/70 | (2006.01) |
| H01L 51/50 | (2006.01) |
| B82Y 20/00 | (2011.01) |
| B82Y 40/00 | (2011.01) |

(52) U.S. Cl.
CPC .......... *C09K 11/703* (2013.01); *H01L 51/502* (2013.01); *B82Y 20/00* (2013.01); *B82Y 40/00* (2013.01)

(56) References Cited

U.S. PATENT DOCUMENTS

| 2010/0289003 A1 | 11/2010 | Kahen et al. |
|---|---|---|
| 2018/0342645 A1* | 11/2018 | Chou .................. H01L 33/0029 |

FOREIGN PATENT DOCUMENTS

| CN | 106590661 A | 4/2017 |
|---|---|---|
| CN | 108264900 A | 7/2018 |
| CN | 108264901 A | 7/2018 |
| CN | 108264905 A | 7/2018 |
| CN | 108546553 A | 9/2018 |
| EP | 2970766 B1 | 2/2019 |
| JP | 2006186317 A | 7/2006 |
| JP | 2011505432 A | 2/2011 |
| JP | 2018199807 A | 12/2018 |
| WO | 2017074897 A1 | 5/2017 |

OTHER PUBLICATIONS

Junsang Cho et al: "Kinetic studies on the formation of various II-VI semiconductor nanocrystals and synthesis of gradient alloy quantum dots emitting in the entire visible range", Journal of Materials Chemistry, vol. 22, No. 21, Jan. 1, 2012, p. 10827.
Esther Groeneveld et al: 11 Tai loring ZnSe—CdSe Colloidal Quantum Dots via Cation Exchange: From Core/Shell to Alloy Nanocrystals, ACS Nano, vol. 7, No. 9, Sep. 24, 2013, pp. 7913-7930.
European Search Report for EP18895296.4 dated Apr. 15, 2021 9 pages.
Esther Groeneveld et al., "Tailoring ZnSe—CdSe Colloidal Quantum Dots via Cation-Exchange: From Core/Shell to Alloy Nanocrystals," ACS Nano, Aug. 13, 2013, vol. 7, No. (9), pp. 7913-7930.
World Intellectual Property Organization (WIPO) International Search Report for PCT/CN2018/123592 dated Mar. 28, 2019 5 Pages.

* cited by examiner

QUANTUM DOT, PREPARATION METHOD THEREFOR AND USE THEREOF

This application is a National Stage entry under § 371 of International Application No. PCT/CN2018/123592, filed on Dec. 25, 2018, and claims priority to Chinese Patent Application Nos. 201711479962.X, 201711475507.2, 201711484247.5, 201711479963.4, and 201711475503.4, filed on Dec. 29, 2017, the entire contents of which are hereby incorporated as reference.

TECHNICAL FIELD

The present disclosure relates to the technical field of quantum dots, more specifically, to a quantum dot and its preparation method and application.

BACKGROUND

A quantum dot is a special material that is limited to the order of nanometers in three dimensions, and the remarkable quantum confinement effect gives quantum dots many unique nano properties, such as continuously adjustable emission wavelength, narrow spectrum of emission wavelength, wide absorption spectrum, high luminous intensity, long florescence life, and good biocompatibility, etc. These characteristics allow quantum dots to have broad application prospects in the fields of biomarkers, flat panel displays, solid-state lighting, photovoltaic solar energy, and other fields.

It is known that, from the theoretical point of view, the emission wavelength of a quantum dot can be easily controlled by changing the size and composition of the quantum dot core. However, for a quantum dot to reach a certain emission wavelength, a lot of experiments in core-forming and growth kinetics are needed, including strictly controlling the reaction time, trying different surface ligand units, optimizing the injection of reaction precursors, etc. The difficulty of achieving the technology mentioned above is more prominent when preparing blue light-emitting quantum dots based on the CdSe system. According to the requirements of quantum size effect, for the blue quantum dots with short emission wavelength (generally <480 nm), the core size of the CdSe quantum dots need to be controlled below 2 nm, and it is difficult to achieve an uniform particle size distribution of the above size under normal reaction conditions. Therefore, the CdSe system is more often used to synthesize larger-sized orange and red light-emitting quantum dots.

In order to solve the above limitation of the band width controllability of the binary component quantum dot system, a multi-alloyed quantum dot system (alloyed QDs) including three or more elements has been successfully developed. The characteristic of alloyed semiconductor materials is that it has the comprehensive characteristics of binary components formed by various constituent elements, including energy band width, exciton Bohr radius, and lattice constant, and this characteristic is also applicable to the quantum dot material system. For example, by doping a wide band gap semiconductor material such as ZnSe or ZnS into a narrow band gap CdSe quantum dot can increase the energy band width of the original quantum dot core, which has great significance for the realization of blue, especially deep blue light-emitting quantum dots. In addition to being able to extend the controllable range of the quantum band gap, alloyed quantum dot system can also provide additional advantages. First, the alloyed interface formed between the core and the shell can be used as a lattice transition layer. Secondly, alloyed quantum dots are not sensitive to the anisotropic spread of quantum dot growth, thus enabling a narrower spectral width.

At present, the most widely used preparation method of alloyed quantum dots is based on the preparation route of the difference in the reactivity of different reaction precursors. For example, in a one-pot reaction, a CdSe@ZnS core-shell quantum dot with a continuous composition gradient structure can be realized by only a step of heat injection reaction. In the early stage of the reaction, highly reactive Se and Cd can form a CdSe-rich code, and the relatively low reactivity of S and Zn mainly participate in the shell growth reaction, thereby forming a gradual gradient change along the radial direction of the quantum dot from the CdSe-rich core phase to the ZnS-rich shell phase.

However, the change in the component distribution of this conventional alloyed quantum dot preparation method is generally realized by pre-adjusting the feeding ratio of the precursor of each component, and the actual reaction process parameters are difficult to adjust the distribution of components. That is, the alloying and the corresponding component distribution in this method are uncontrollable during the reaction, thus greatly limiting the precise control of the component distribution in the alloyed quantum dots.

Therefore, the conventional technology needs to be improved and developed.

SUMMARY

A quantum dot preparation method including the steps of providing a first quantum dot core growth reaction system to perform a first quantum dot core growth, precursors in the first quantum dot core growth reaction system includes a metal element precursor and a non-metal element precursor, the metal element precursor includes at least a metal element $M^1$ precursor, and the metal element in the first quantum dot core includes at least the metal element $M^1$; adding a precursor of a metal element $M^2$ to the first quantum dot core growth reaction system during the growth process of the first quantum dot core; and interrupting the growth of the first quantum dot core to make the metal element $M^2$ and the metal element $M^1$ in the first quantum dot core exchange cations to perform a second quantum dot core growth, the metal element $M^1$ and the metal element $M^2$ are different.

A quantum dot including a quantum dot core and a first semiconductor shell layer covering the quantum dot core; the quantum dot is composed of a metal element $M^1$, a metal element $M^2$, and a non-metal element; and in the quantum dot core, along a radius direction of the quantum dot, contents of the metal element $M^2$ gradually increases from inside to outside, and contents of the metal element $M^1$ gradually decreases from inside to outside.

An application of quantum dots, where the quantum dots are used as functional materials for preparing a semiconductor device.

Advantage: In this method, the distribution of alloyed components can be adjusted not only by changing the feeding ratio of metal elements and non-metal elements, but also in a more real-time, more direct, and more precise manner through each reaction condition parameter of the actual reaction process, thereby achieving a more precise composition and energy level distribution control for alloyed quantum dots.

DETAILED DESCRIPTION OF THE EMBODIMENTS

To make the objectives, technical solutions, and effects of the present disclosure clearer and more specific, the present disclosure will be described in further detail below. It should be understood that the embodiment and specific examples described herein are only used to explain the present disclosure, and are not intended to limit the present disclosure.

It should be understood that the flowing concepts in the embodiments of the present disclosure are conventional expressions in the art. For example, "the composition of the first quantum dot core is $M^1X^1$" indicates that the first quantum dot is composed of a metal element $M^1$ and a non-metal element $X^1$, but does not involve the specific selection of the content of the various components. Only when there are specific requirements on the content, for example, "the composition of the second quantum dot core is $M^1_cM^2_{1-c}X^1$", the second quantum dot is composed of a metal element $M^1$, a metal element $M^2$, and a non-metal element $X^1$, where "c" and "1−c" respectively express the content proportion of the metal element $M^1$ and the metal element $M^2$.

The change in the component distribution of this conventional alloyed quantum dot preparation method is generally realized by pre-adjusting the feeding ratio of the precursor of each component, and the actual reaction process parameters are difficult to adjust the distribution of components. That is, the alloying and the corresponding component distribution in this method are uncontrollable during the reaction, thus limiting the precise control of the component distribution in the alloyed quantum dots. In order to solve the above-mentioned problems in the conventional alloyed quantum dot preparation method, embodiments of the present disclosure provide a new method for preparing alloyed quantum dots. In this method, the distribution of alloyed components can be adjusted not only by changing the feeding ratio of metal elements and non-metal elements as in conventional methods, but also in a more real-time, more direct, and more precise manner through each reaction condition parameter of the actual reaction process, thereby achieving a more precise composition and energy level distribution control for the alloyed quantum dots.

Figure 1:
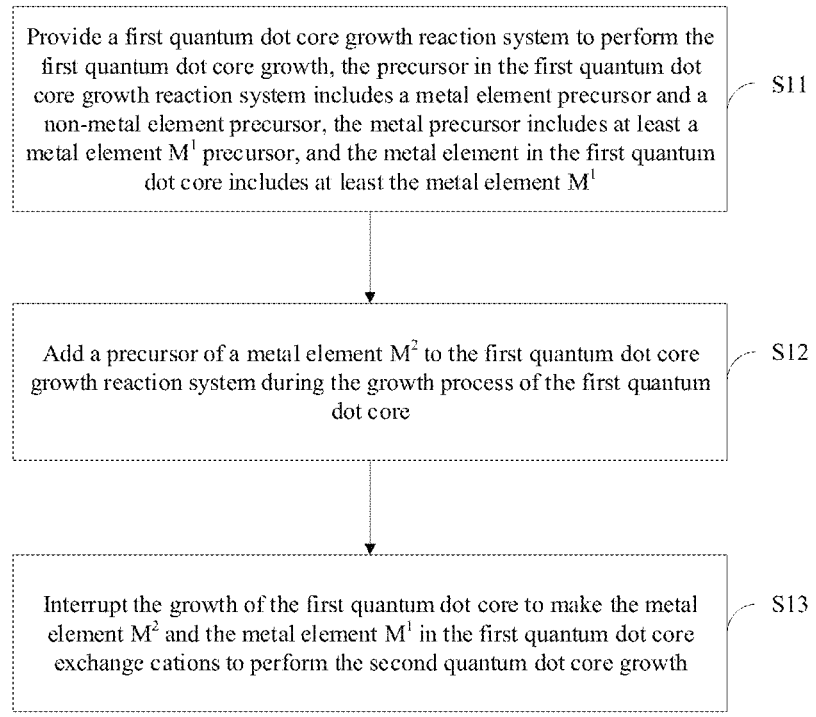
FIG. 1 is a flowchart of a method for preparing quantum dots according to some embodiments of the present disclosure.

Referring to FIG. 1, which is a flowchart of a method for preparing quantum dots according to some embodiments of the present disclosure. The method includes the following steps.

S11, providing a first quantum dot core growth reaction system to perform the first quantum dot core growth. The precursor in the first quantum dot core growth reaction system may include a metal element precursor and a non-metal element precursor. The metal element precursor may include at least a metal element $M^1$ precursor, and the metal element in the first quantum dot core may include at least the metal element $M^1$.

S12, adding a precursor of a metal element $M^2$ to the first quantum dot core growth reaction system during the growth process of the first quantum dot core.

S13, interrupting the growth of the first quantum dot core to make the metal element $M^2$ and the metal element $M^1$ in the first quantum dot core exchange cations to perform the second quantum dot core growth.

The method for realizing alloyed quantum dots provided by the embodiments of the present disclosure first forms a compound quantum dot core, and then the precursor of the metal element $M^2$ to be alloyed is added to the reaction system containing the compound quantum dot core. The metal element $M^2$ may undergo cation exchange with the metal element $M^1$ in the existing compound quantum dot core. The closer to the surface, the higher the probability that $M^2$ may undergo a cation exchange reaction and enter the quantum dot core, therefore, the higher the distribution of $M^2$ near the surface. In addition, the further away from the surface, the lower the probability that $M^2$ may undergo a cation exchange reaction and enter the quantum dot core, therefore, the lower the distribution of $M^2$ away the surface (i.e., near the center). As such, a quantum dot with an alloyed core may be formed in which the content of $M^2$ may gradually increase from the inside to the outside, and the content of $M^1$ may gradually decrease from the inside to the outside. In this method, the composition distribution of alloy core can be adjusted not only by changing the feeding ratio of metal elements and non-metal elements, but also in a more real-time, more direct, and more precise manner through each reaction condition parameter of the actual reaction process, thereby achieving a more precise composition and energy level distribution control of the alloy core. The "interruption" in the embodiment of the present disclosure refers to that the growth process of the generating component in the original reaction system is terminated and shifts to the growth of another generating component. By making a more real-time, more direct, and more precise adjustments through each reaction condition parameter of the actual reaction process, a more precise composition and energy level distribution control for the alloyed quantum dots can be achieved. For example, in some embodiments, the precursor in the first quantum dot core growth reaction system may be a precursor of the metal element $M^1$ and a precursor of a non-metal element $X^1$, and the composition of the first quantum dot may be $M^1X^1$. In some specific embodiments, a precursor of the metal element $M^2$ may be added to the first quantum dot core growth reaction system, the growth of the first quantum dot core may be interrupted to make the metal element $M^2$ and the metal element $M^1$ in the first quantum dot core undergo cation exchange, and the growth of the second quantum dot core $M^1M^2X^1$ may be performed. The original process of growing the first quantum dot core $M^1X^1$ is terminated, and the metal element $M^2$ undergoes cation exchange with the metal element M1 in the first quantum dot core $M^1X^1$ to turn to the growth of the second quantum dot core $M^1M^2X^1$. Generally speaking, the interruption can be achieved by temperature adjustment to promote the progress of the cation exchange. In some cases, it may not be necessary to adjust the reaction condition parameters to achieve the purpose of interruption. For example, by adjusting the temperature of the cation exchange reaction, the degree and probability of $M^2$ entering into the center in the radial direction can be changed. The higher the temperature, the higher the probability of $M^2$ performing cation exchange reaction and entering the quantum dot core, and the deeper the penetration into the quantum dot core. Further, it is possible to change the timing of the $M^2$ precursor addition. The earlier the addition time, the shorter the formation time of the existing compound quantum dot core and smaller the size, as such, the closer the component distribution of $M^2$ may be to the center of the quantum dot core. Conversely, the later the time of addition, the longer the formation time of the existing compound quantum dot core and larger the size, as such, the farther away the component distribution of $M^2$ may be to the center of the quantum dot core. In addition, the cation exchange reaction time may be changed after the $M^2$ precursor is added. Within a certain time range, the longer the reaction time, the higher the probability of $M^2$ cation exchange reaction entering the quantum dot core, and the deeper the penetration into the quantum dot core. It should be noted that if the quantum dot is spherical or similar to a spherical structure and the core of the quantum dot is also spherical or similar to a spherical structure, the direction along the radius of the quantum dot may refer to the direction from the physical center of the quantum dot extending to the surface of the quantum dot.

In some embodiments, the metal element $M^1$ and the metal element $M^2$ may be different, and the metal element $M^1$ and the metal element $M^2$ may be independently selected from one of Zn, Cd, Hg, Al, In, and Ga.

In some embodiments, the metal element $M^1$ may be Ga, and the metal element $M^2$ may be In.

In some embodiments, the metal element $M^1$ may be Zn, and the metal element $M^2$ may be Cd.

Generally, the energy band gap such as InP, CdS, and CdSe are relatively narrow and the Bohr radius is relatively large, making it difficult to prepare quantum dots with short emission wavelength (such as blue). Through the conventional method of alloying quantum dots, metal elements with a wide band gap such as Ga or Zn can be added at the same time during preparation. However, since the reactivity of these metal elements is much lower than that of In or Cd, and the conventional method of alloying quantum dots can only adjust the component distribution by changing the feeding amount, the composition distribution of Ga or Zn can only be effectively formed in the alloyed quantum dots when the feeding amount of Ga or Zn is much higher than that of In or Cd. This greatly limits the adjustable range of the distribution of each element composition, and the performance of the quantum dots formed cannot be optimized. In this optimized implementation, by using sufficient condition optimization, $M^1$ with a relatively small ionic radius (i.e., low activity) is formed into a high-quality $M^1X^1$ binary compound first quantum dot core, and $M^2$ with a relatively large ionic radius (i.e., high activity) is added for cation exchange. At this time, the component distribution of highly active $M^2$ can be adjusted not only by changing the relative feeding amount, but also by controlling various reaction conditions such as the timing of $M^2$ addition, reaction temperature, cation exchange reaction time, etc. As such, a sufficient space may be provided for component distribution control and final quantum dot optimization, and the preparation of short-wave quantum dots based on InP and CdSe alloy systems may be realized, thereby expanding the coverage of the emission wavelength. At this time, the metal element $M^2$ corresponding to the narrow energy band gap is alloyed into the original first quantum dot core, as such, the second quantum dot core may be red-shifted in wavelength compared to the original first quantum dot core.

In some embodiments, the metal element $M^1$ may be Cd, and the metal element $M^2$ may be Zn.

In some embodiments, the metal element $M^1$ may be In, and the metal element $M^2$ may be Ga.

In CdS, CdSe, and InP, since the relatively of the metal elements and non-metal elements are relatively high and the corresponding Bohr radius is relatively large, the reaction rate may be relative fast during core forming. The reaction kinetics for the formed CdSe and InP core can be difficult to control, which can cause uneven size distribution, as such, the quantum dot may have a wide emission peak width. The conventional alloying method adds metal elements with relatively small ionic radius (i.e., low activity) at the same time. However, since the reaction activity is weak, there is nearly no improvement in the reaction kinetics. As such, the above-mentioned problem of the emission peak width cannot be solved. In this optimized embodiment, $M^2$ with a relatively small ionic radius (i.e., low reactivity) is added to the first quantum dot core of the already formed $M1X^1$ binary compound with a narrow energy band gap for cation exchange reaction. The controllable cation exchange reaction can effectively improve the size and component uniformity of quantum dots, thereby effectively narrowing emission peak width of the quantum dots. At the same time, due to the alloying of the metal element $M^2$ corresponding to the wide energy band gap into the original first quantum dot core, the effective Bohr radius of the first quantum dot core may be decreased, that is, the quantum size effect under the same size may be weakened, which also helps to further reduce the emission peak width of the quantum dots. Due to the alloying of the metal element $M^2$ corresponding to the wide energy band gap into the original first quantum dot core, the emission peak wavelength of the second quantum dot core may be blue-shifted compared to the original first quantum dot core.

In some specific embodiments, the Zn precursor may include, but is not limited thereto, one or more of dimethyl Zinc, diethyl Zinc, Zinc acetate, Zinc acetylacetonate, Zinc iodide, Zinc bromide, Zinc chloride, Zinc fluoride, Zinc carbonate, Zinc cyanide, Zinc nitrate, Zinc oxide, Zinc peroxide, Zinc perchlorate, Zinc sulfate, Zinc oleate, or Zinc stearate.

In some specific embodiments, the Cd precursor may include, but is not limited thereto, one or more of dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, cadmium oleate, or cadmium stearate.

In some specific embodiments, the Hg precursor may include, but is not limited thereto, one or more of dimethyl mercury, diethyl mercury, mercury acetate, mercury acetylacetonate, mercury iodide, mercury bromide, mercury chloride, mercury fluoride, mercury carbonate, mercury nitrate, mercury oxide, mercury perchlorate, mercury phosphide, mercury sulfate, mercury oleate, or mercury stearate.

In some specific embodiments, the Al precursor may include, but is not limited thereto, one or more of aluminum phosphate, aluminum acetate, aluminum acetylacetonate, aluminum iodide, aluminum bromide, aluminum chloride, aluminum fluoride, aluminum carbonate, aluminum cyanide, aluminum nitrate, aluminum oxide, aluminum peroxide, aluminum sulfate, aluminum oleate, aluminum stearate, aluminum myristate, or aluminum palmitate.

In some specific embodiments, the In precursor may include, but is not limited thereto, one or more of indium phosphate, indium acetate, indium acetylacetonate, indium iodide, indium bromide, indium chloride, indium fluoride, indium carbonate, indium cyanide, indium nitrate, indium oxide, indium peroxide, indium sulfate, indium oleate, indium stearate, indium myristate, or indium palmitate.

In some specific embodiments, the Ga precursor may include, but is not limited thereto, one or more of gallium phosphate, gallium acetate, gallium acetylacetonate, gallium iodide, gallium bromide, gallium chloride, gallium fluoride, gallium carbonate, gallium cyanide, gallium nitrate, gallium oxide, gallium peroxide, gallium sulfate, gallium oleate, gallium stearate, gallium myristate, or gallium palmitate.

Figure 2:
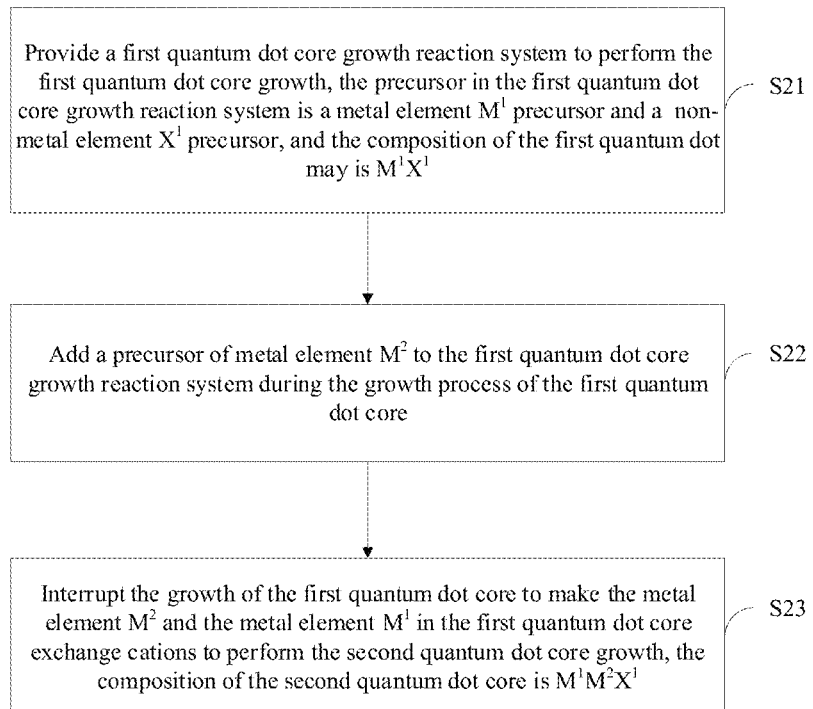
FIG. 2 is a flowchart of a method for preparing quantum dots according to other embodiments of the present disclosure.

Referring to FIG. 2, which is a flowchart of a method for preparing quantum dots according to other embodiments of the present disclosure. The method includes the following steps.

S21, providing a first quantum dot core growth reaction system to perform the first quantum dot core growth. The precursor in the first quantum dot core growth reaction system may be a metal element $M^1$ precursor and a non-metal element $X^1$ precursor, and the composition of the first quantum dot may be $M^1X^1$.

S22, adding a precursor of metal element $M^2$ to the first quantum dot core growth reaction system during the growth process of the first quantum dot core.

S23, interrupting the growth of the first quantum dot core to make the metal element $M^2$ and the metal element $M^1$ in the first quantum dot core exchange cations to perform the second quantum dot core growth, the composition of the second quantum dot core may be $M^1M^2X^1$.

In some embodiments, the non-metal element X1 may be selected from one or S, Se, Te, N, P, and As.

The precursor of Se may be a compound formed by Se element and some organic substances. In some embodiments, the precursor of Se may include, but is not limited thereto, one or more of Se-TOP, Se-TBP, Se-TPP, Se-ODE, Se-OA (selenium-oleic acid), Se-ODA (selenium-octadecylamine), Se-TOA (selenium-trioctylamine), Se-ODPA (selenium-octadecylphosphonic acid), Se-OLA (selenium-oleylamine), or Se-OCA (selenium-octylamine).

The precursor of S may be a compound formed by S element and some organic substances. In some embodiments, the precursor of S may include, but is not limited thereto, one or more of S-TOP, S-TBP, S-TPP, S-ODE, S-OA, S-ODA, S-TOA, S-ODPA, S-OLA, S-OCA, alkyl mercaptan (such as hexanethiol), octanethiol, decanethiol, dodecanethiol, hexadecanethiol, or mercaptopropylsilane.

The precursor of Te may be a compound formed by Te element and some organic substances. In some embodiments, the precursor of Te may include, but is not limited thereto, one or more of Te-TOP, Te-TBP, Te-TPP, Te-ODE, Te-OA, Te-ODA, Te-TOA, Te-ODPA, Te-OLA, or Te-OCA.

In some specific embodiments, the precursor of N may include, but is not limited thereto, one or more of nitric oxide, nitric acid, or ammonium nitrate.

In some specific embodiments, the precursor of P may include, but is not limited thereto, one or more of tris (trimethylsilyl) phosphine, or alkyl phosphines (such as triethyl phosphine, tributyl phosphine, trioctyl phosphine, triphenyl phosphine, and tricyclohexyl phosphine).

In some specific embodiments, the precursor of As may include, but is not limited thereto, one or more of arsenic iodide, arsenic bromide, arsenic chloride, arsenic oxide, or arsenic sulfate.

In some embodiments, the method further includes the step of forming a first semiconductor shell on the surface of the second quantum dot core.

In some specific embodiments, the material of the first semiconductor shell layer may be selected from group II-VI semiconductor materials or group III-V semiconductor materials. In some specific embodiments, the material of the first semiconductor shell layer may be selected from group II-VI semiconductor materials. The group II-VI semiconductor materials may be selected from, but is not limited thereto, one of CdSe, CdS, CdTe, CdSeS, CdSeTe, CdSTe, ZnSe, ZnS, ZnTe, ZnSeS, ZnSeTe, ZnSTe, HgSe, HgS, HgTe, HgSeS, HgSeTe, and HgSTe. In some specific embodiments, the material of the first semiconductor shell layer may be selected from group III-V semiconductor materials. The group II-VI semiconductor materials may be selected from, but is not limited thereto, one of GaN, GaP, GaAs, InP, InAs, InAsP, GaAsP, InGaP, InGaAs, and InGaAs.

In some embodiments, the quantum dots may have a peak wavelength range of 300-780 nm.

In some embodiments, the half-peak width of the emission peak of the quantum dots may be 12-80 nm.

In some embodiments, the quantum yield of the quantum dots may be in the range of 20-100%.

The conventional alloyed quantum dots are generally prepared by simultaneously adding metal element and non-metal element precursors required for alloying, and using different metal elements or non-metal elements with different reactivity to spontaneously form alloyed quantum dots with a certain component distribution gradient. The metal elements or non-metal elements with high reactivity will participate in the reaction first, as such, these elements may be distributed closer to the center, and the component distribution along the radial direction outward may be gradually reduced. Similarly, the metal elements or non-metal elements with low reactivity will participate in the reaction later, as such, these elements may be distributed farther away from the center, and the component distribution along the radial direction outward may be gradually increased. In this method, the change of the component distribution of the metal elements or non-metal elements is generally achieved by adjusting the feeding ratio of the precursors in each component in advance. However, it is difficult to use the parameters of each reaction condition in the actual reaction process to achieve the adjustment of the component distribution, that is, the alloying and corresponding component distribution in this method are uncontrollable during the reaction process. As such, it is necessary to continuously trying different groups of precursors with different proportions when trying to achieve the target component distribution. By using the component distribution of the final reaction result as feedback, the precursor feeding may be adjusted, and the target component distribution may be reached by repeated attempts. Therefore, the precis control of the component distribution in alloyed quantum dots is greatly limited. It should be noted that if the quantum dot is spherical or similar to a spherical structure and the core of the quantum dot is also spherical or similar to a spherical structure, the direction along the radius of the quantum dot may refer to the direction from the physical center of the quantum dot extending to the surface of the quantum dot.

In the method for relieving alloyed quantum dots provided by the embodiments of the present disclosure, at first, a binary compound quantum dot core is formed, then the precursor of the metal element $M^2$ to be alloyed is added to the reaction system containing the binary compound quantum dot core. The metal element $M2$ will undergo cation exchange with the metal element $M^1$ in the existing binary compound quantum dot core. The closer to the surface, the higher the probability that $M^2$ will undergo a cation exchange reaction and enter the quantum dot core. Therefore, the component distribution of $M^2$ near the surface may be higher. In addition, the farther away from the surface, the lower the probability that $M^2$ will undergo a cation exchange reaction and enter the quantum dot core. Therefore, the component distribution of $M^2$ away from the surface (i.e., near the center) may be lower. As such, a quantum dot with an alloy core may be formed in which the component distribution of $M^2$ may gradually increase in the radial direction outward, and the component distribution of $M^1$ may be gradually decrease in the radial direction outward. In this method, the composition distribution of alloy core can be adjusted not only by changing the feeding ratio of metal elements and non-metal elements, but also in a more real-time, more direct, and more precise manner through each reaction condition parameter of the actual reaction process, thereby achieving a more precise composition and energy level distribution control of the alloy core. For example, by adjusting the temperature of the cation exchange reaction, the degree and probability of $M^2$ entering into the center in the radial direction can be changed. The higher the temperature, the higher the probability of $M^2$ performing cation exchange reaction and entering the quantum dot core, and the deeper the penetration into the quantum dot core. Further, it is possible to change the timing of the $M^2$ precursor addition. The earlier the addition time, the shorter the formation time of the existing compound quantum dot core and smaller the size, as such, the closer the component distribution of $M^2$ may be to the center of the quantum dot core. Conversely, the later the time of addition, the longer the formation time of the existing compound quantum dot core and larger the size, as such, the farther away the component distribution of $M^2$ may be to the center of the quantum dot core. In addition, the cation exchange reaction time may be changed after the $M^2$ precursor is added. Within a certain time range, the longer the reaction time, the higher the probability of $M^2$ cation exchange reaction entering the quantum dot core, and the deeper the penetration into the quantum dot core.

In some embodiments, a second quantum dot core may be obtained. Before the first semiconductor shell layer is formed on the surface of the second quantum dot core, the method may further include a step of adding a precursor of a metal element $M^3$ and a precursor of a non-mental element $X^3$ during the growth process of the second quantum dot core; and interrupting the growth of the second quantum dot core, and growing a third semiconductor shell $M^3X^3$ on the surface of the second quantum dot core. In some specific embodiments, the metal element $M^3$ may be the same or different from the metal element $M^1$ and the metal element $M^2$; and the non-metal element $X^3$ may be the same or different from the non-mental element $X^1$.

A precursor of a metal element $M^4$ may be added during the growth process of the third semiconductor shell layer. The metal element $M^3$ may be different from the metal element $M^4$. The growth of the third semiconductor shell $M^3X^3$ may be interrupted, and the metal element $M^4$ and the metal element $M^3$ in the third semiconductor shell layer may be subjected to a cation exchange reaction to prepare a second semiconductor shell layer $M^3M^4X^3$.

In some embodiments, the metal element $M^3$ may be different from the metal element $M4$. In some embodiments, the metal element $M^3$ and the metal element $M4$ may be independently selected from one of Zn, Cd, Hg, Al, In, and Ga. The selection of specific precursors of Zn, Cd, Hg, Al, In, and Ga is described in detail above, and will not be repeated here. In some embodiments, the non-metal element $X3$ may be selected from one of S, Se, Te, N, P, and As. The selection of precursors for specific elements is described in detail above, and will not be repeated here.

On the basis of effectively realizing and controlling the quantum dot alloy core, the embodiments of the present disclosure further provides a similar that forms a quantum dot alloy shell layer coated on the surface of the quantum dot alloy core, which can also effectively control the distribution of various components of the quantum dot alloy shell layer. The control and optimization of the component distribution of the quantum dot alloy shell layer can realize the effective binding of the charge in the quantum dot, reduce the lattice mismatch between the quantum dot core and shell, and reduce the probability of quantum flicker, thereby improving the emission performance of the quantum dots. For the application of quantum dot electroluminescent devices, the optimization of the quantum dot alloy shell layer can effectively improve the injection and binding of charges, thereby improving the efficiency of the device.

In some specific embodiments, the metal element $M^4$ may have a larger ionic radius than the metal element $M^3$, and the emission wavelength of the quantum dot may shift red.

In some embodiments, the metal element $M^3$ may be Ga, and the metal element $M^4$ may be In. In some specific embodiments, the composition of the second semiconductor shell layer may be GaInP.

In some embodiments, the metal element $M^3$ may be Zn, and the metal element $M^4$ may be Cd. In some specific embodiments, the composition of the second semiconductor shell layer may be ZnCdS or ZnCdSe.

Generally, the energy band gap such as InP, CdS, and CdSe are relatively narrow and the Bohr radius is relatively large, making it difficult to prepare quantum dots with short emission wavelength (such as blue). Through the conventional method of alloying quantum dots, metal elements with a wide band gap such as Ga or Zn can be added at the same time during preparation. However, since the reactivity of these metal elements is much lower than that of In or Cd, and the conventional method of alloying quantum dots can only adjust the component distribution by changing the feeding amount, the composition distribution of Ga or Zn can only be effectively formed in the alloyed quantum dots when the feeding amount of Ga or Zn is much higher than that of In or Cd. This greatly limits the adjustable range of the distribution of each element composition, and the performance of the quantum dots formed cannot be optimized. In this optimized implementation, by using sufficient condition optimization, $M^3$ with a relatively small ionic radius (i.e., low activity) is formed into a high-quality $M^3X^3$ binary compound shell layer, and $M^4$ with a relatively large ionic radius (i.e., high activity) is added for cation exchange. At this time, the component distribution of highly active $M^4$ can be adjusted not only by changing the relative feeding amount, but also by controlling various reaction conditions such as the timing of $M^4$ addition, reaction temperature, cation exchange reaction time, etc. As such, a sufficient space may be provided for component distribution control and final quantum dot optimization, and the preparation of short-wave quantum dots based on InP and CdSe alloy systems may be realized, thereby expanding the coverage of the emission wavelength. At this time, due to the alloying of the metal element $M^4$ corresponding to the narrow energy band gap into the semiconductor shell layer, the wavelength of the emission peak may be red-shifted.

In some embodiments, the metal element $M^4$ described in the present disclosure may have a smaller ionic radius than the metal element $M^3$, and the wavelength of the quantum dot emission peak may be blue-shifted.

In some embodiments, the metal element $M^3$ may be Cd, and the metal element $M^4$ may be Zn. In some specific embodiments, the composition of the second semiconductor shell layer may be CdZnS or CdZnSe.

In some embodiments, the metal element $M^3$ may be In, and the metal element $M^4$ may be Ga. In some specific embodiments, the composition of the second semiconductor shell layer may be InGaP.

In CdS, CdSe, and InP, since the relatively of the metal elements and non-metal elements are relatively high and the corresponding Bohr radius is relatively large, the reaction rate may be relative fast during core forming. The reaction kinetics for the formed CdSe and InP core can be difficult to control, which can cause uneven size distribution, as such, the quantum dot may have a wide emission peak width. The conventional alloying method adds metal elements with relatively small ionic radius (i.e., low activity) at the same time. However, since the reaction activity is weak, there is nearly no improvement in the reaction kinetics. As such, the above-mentioned problem of the emission peak width cannot be solved. In this optimized embodiment, $M^2$ with a relatively small ionic radius (i.e., low reactivity) is added to the first quantum dot core of the already formed $M^1X^1$ binary compound with a narrow energy band gap for cation exchange reaction. The controllable cation exchange reaction can effectively improve the size and component uniformity of quantum dots, thereby effectively narrowing emission peak width of the quantum dots. At the same time, due to the alloying of the metal element $M^2$ corresponding to the wide energy band gap into the original first quantum dot core, the effective Bohr radius of the first quantum dot core may be decreased, that is, the quantum size effect under the same size may be weakened, which also helps to further reduce the emission peak width of the quantum dots. Due to the alloying of the metal element $M^2$ corresponding to the wide energy band gap into the original first quantum dot core, the emission peak wavelength of the second quantum dot core $M^1M^2X^1$ may be blue-shifted compared to the original first quantum dot core $M^1X^1$.

Figure 3:
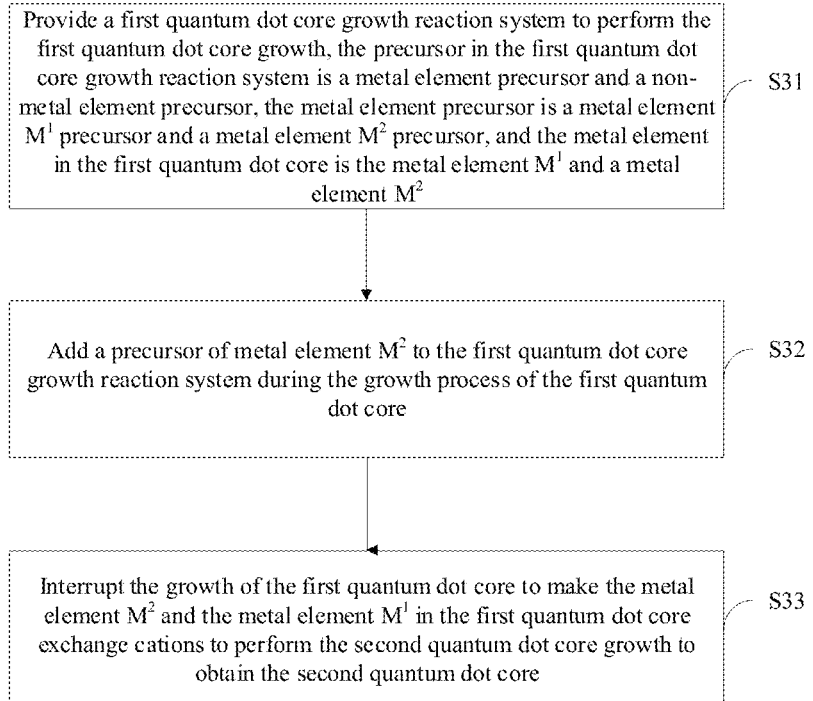
FIG. 3 is a flowchart of a method for preparing quantum dots according to still other embodiments of the present disclosure.

Referring to FIG. 3, which is a flowchart of a method for preparing quantum dots according to still other embodiments of the present disclosure. The method includes the following steps.

S31, providing a first quantum dot core growth reaction system to perform the first quantum dot core growth. The precursors in the first quantum dot core growth reaction system may be a metal element precursor and a non-metal element precursor. The metal element precursor may be a metal element $M^1$ precursor, and a metal element $M^2$ precursor, and the metal element in the first quantum dot core may be the metal element $M^1$ and a metal element $M^2$.

S32, adding a precursor of metal element $M^2$ to the first quantum dot core growth reaction system during the growth process of the first quantum dot core.

S33, interrupting the growth of the first quantum dot core to make the metal element $M^2$ and the metal element $M^1$ in the first quantum dot core exchange cations to perform the second quantum dot core growth to obtain the second quantum dot core.

In some specific embodiments, when the precursor of the non-metal element is the precursor of the non-metal element $X^1$, the precursor of the metal element $M^2$ may be added to the first quantum dot core growth system, and the composition of the first quantum dot may be $M^1_aM^2_{1-a}X^1$. The growth of the first quantum dot core may be interrupt, such that the metal element $M^2$ may exchange cation with the metal element $M^1$ in the first quantum dot $M^1_aM^2_{1-a}X^1$, and growth the second quantum dot core $M^1_bM^2_{1-b}X^1$, where $0<a<1$, $0<b<1$, and $b<a$. At the end, the second quantum dot core $M^1_bM^2_{1-b}X^1$ is obtained.

In some specific embodiments, when the precursor of the non-metal element is the precursor of the non-metal element $X^1$ and the precursor of the non-metal element $X^2$, the first quantum dot core $M^1_aM^2_{1-a}X^1X^2$ may be formed. The precursor of the metal element $M^2$ may be added to the first quantum dot core growth reaction system. The growth of the first quantum dot core may be interrupted to form the first quantum dot core $M^1_aM^2_{1-a}X^1X^2$. The metal element $M^2$ may exchange cation with the metal element $M^1$ in the first quantum dot core $M^1_aM^2_{1-a}X^1X^2$ to grow the second quantum dot core $M^1_bM^2_{1-b}X^1X^2$, where $0<a<1$, $0<b<1$, and $b<a$. At the end, the second quantum dot core $M^1_bM^2_{1-b}X^1X^2$ is obtained.

In some embodiments, the metal element $M^1$ may be Ga, and the metal element $M^2$ may be In.

In some embodiments, the metal element $M^1$ may be Zn, and the metal element $M^2$ may be Cd.

Generally, the energy band gap such as InP, CdS, and CdSe are relatively narrow and the Bohr radius is relatively large, making it difficult to prepare quantum dots with short emission wavelength (such as blue). Through the conventional method of alloying quantum dots, metal elements with a wide band gap such as Ga or Zn can be added at the same time during preparation. However, since the reactivity of these metal elements is much lower than that of In or Cd, and the conventional method of alloying quantum dots can only adjust the component distribution by changing the feeding amount, the composition distribution of Ga or Zn can only be effectively formed in the alloyed quantum dots when the feeding amount of Ga or Zn is much higher than that of In or Cd. This greatly limits the adjustable range of the distribution of each element composition, and the performance of the quantum dots formed cannot be optimized. In this optimized implementation, by using sufficient condition optimization, $M^1$ with a relatively small ionic radius (i.e., low activity) is formed into a high-quality $M^1X^1$ binary compound first quantum dot core, and $M^2$ with a relatively large ionic radius (i.e., high activity) is added for cation exchange. At this time, the component distribution of highly active $M^2$ can be adjusted not only by changing the relative feeding amount, but also by controlling various reaction conditions such as the timing of $M^2$ addition, reaction temperature, cation exchange reaction time, etc. As such, a sufficient space may be provided for component distribution control and final quantum dot optimization, and the preparation of short-wave quantum dots based on InP and CdSe alloy systems may be realized, thereby expanding the coverage of the emission wavelength. At this time, the metal element $M^2$ corresponding to the narrow energy band gap is alloyed into the original first quantum dot core, as such, the second quantum dot core may be red-shifted in wavelength compared to the original first quantum dot core.

In some embodiments, the metal element $M^1$ may be Cd, and the metal element $M^2$ may be Zn.

In some embodiments, the metal element $M^1$ may be In, and the metal element $M^2$ may be Ga.

In CdS, CdSe, and InP, since the relatively of the metal elements and non-metal elements are relatively high and the corresponding Bohr radius is relatively large, the reaction rate may be relative fast during core forming. The reaction kinetics for the formed CdSe and InP core can be difficult to control, which can cause uneven size distribution, as such, the quantum dot may have a wide emission peak width. The conventional alloying method adds metal elements with relatively small ionic radius (i.e., low activity) at the same time. However, since the reaction activity is weak, there is nearly no improvement in the reaction kinetics. As such, the above-mentioned problem of the emission peak width cannot be solved. In this optimized embodiment, $M^2$ with a relatively small ionic radius (i.e., low reactivity) is added to the first quantum dot core of the already formed $M^1X^1$ binary compound with a narrow energy band gap for cation exchange reaction. The controllable cation exchange reaction can effectively improve the size and component uniformity of quantum dots, thereby effectively narrowing emission peak width of the quantum dots. At the same time, due to the alloying of the metal element $M^2$ corresponding to the wide energy band gap into the original first quantum dot core, the effective Bohr radius of the first quantum dot core may be decreased, that is, the quantum size effect under the same size may be weakened, which also helps to further reduce the emission peak width of the quantum dots. Due to the alloying of the metal element $M^2$ corresponding to the wide energy band gap into the original first quantum dot core, the emission peak wavelength of the second quantum dot core may be blue-shifted compared to the original first quantum dot core.

In some embodiments, the metal element $M^1$ and the metal element $M^2$ may be different, and the non-metal element $X^1$ and the non-metal element $X^2$ may be different. The selections of the metal element $M^1$, the metal element $M^2$, the non-metal element $X^1$, and the non-metal element $X^2$ are described above, and will not be repeated here.

In some embodiments, the alloy quantum dots (i.e., the $M^1_aM^2_{1-a}X^1$ quantum dot core or the $M^1_aM^2_{1-a}X^1X^2$ quantum dot core) that have been formed by the conventional alloying method can be further adjusted and optimized for component distribution by using the method provided in the present disclosure, thereby effectively solving the problem that the component distribution of existing quantum dots prepared by the conventional alloying method cannot meet the demand. Since the method of the present disclosure is used to adjust the component distribution, the quantum dots can also be adjusted by changing the feeding ratio of the metal elements and the non-metal elements. Further, the quantum dots can also be adjusted in a more real-time, more direct, and more precise manner through each reaction condition parameter of the actual reaction process, thereby achieving a more precise composition and energy level distribution control for alloyed quantum dots.

Figure 4:
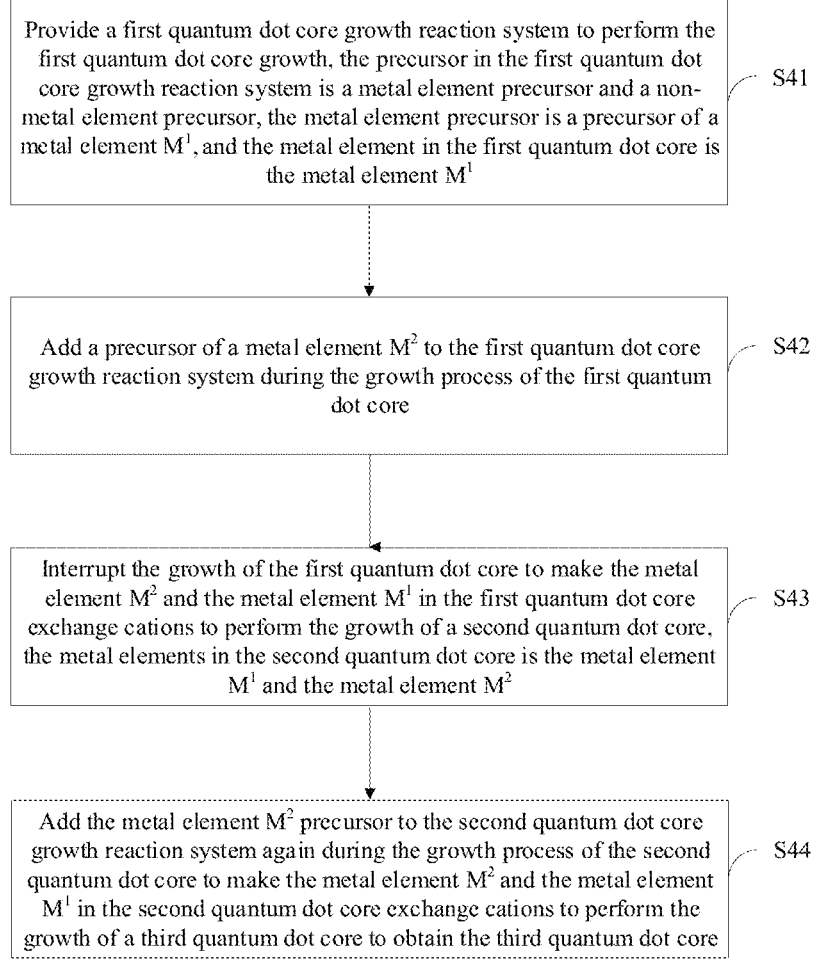
FIG. 4 is a flowchart of a method for preparing quantum dots according to yet other embodiments of the present disclosure.

Referring to FIG. 4, which is a flowchart of a method for preparing quantum dots according to yet other embodiments of the present disclosure. The method includes the following steps.

S41, providing a first quantum dot core growth reaction system to perform the first quantum dot core growth. The precursor in the first quantum dot core growth reaction system may be a metal element precursor and a non-metal element precursor. The metal element precursor may be a precursor of a metal element $M^1$, and the metal element in the first quantum dot core may be the metal element $M^1$.

S42, adding a precursor of a metal element $M^2$ to the first quantum dot core growth reaction system.

S43, interrupting the growth of the first quantum dot core to make the metal element $M^2$ and the metal element $M^1$ in the first quantum dot core exchange cations to perform the growth of a second quantum dot core, where the metal elements in the second quantum dot core may be the metal element $M^1$ and the metal element $M^2$.

S44, adding the precursor of the metal element $M^2$ to the second quantum dot core growth reaction system again during the growth process of the second quantum dot core to make the metal element $M^2$ and the metal element $M^1$ in the second quantum dot core exchange cations to perform the growth of a third quantum dot core to obtain the third quantum dot core.

In some specific embodiments, when the non-metal element precursor is the precursor of the non-metal element $X^1$, the composition of the first quantum dot core may be $M^1X^1$. The precursor of the metal element $M^2$ may be added to the first quantum dot core growth reaction system. In addition, the growth of the first quantum dot core may be interrupted to make the metal element $M^2$ and the metal element $M^1$ in the first quantum dot core $M^1X^1$ undergo cation exchange, and grow the second quantum dot core, where the composition of the second quantum dot core may be $M^1_cM^2_{1-c}X^1$, where $0.4<c<0.9$. The precursor of the metal element M2 may be added to the second quantum dot core $M^1_cM^2_{1-c}X^1$ growth reaction system again. As such, the metal element $M^2$ and the metal element $M^1$ in the second quantum dot core $M^1_cM^2_{1-c}X^1$ undergo cation exchange, and grow the third quantum dot core. The composition of the third quantum dot core may be $M^1_dM^2_{1-d}X^1$, where $0<d<0.9$, $d<c$. At the end, the third quantum dot core $M^1_dM^2_{1-d}X^1$ is obtained.

In some specific embodiments, when the non-metal element precursor is the precursor of the non-metal element $X^1$ and a precursor of the non-metal element $X^2$, the composition of the first quantum dot core may be $M^1X^1X^2$. The precursor of the metal element $M^2$ may be added to the first quantum dot core growth reaction system. In addition, the growth of the first quantum dot core may be interrupted to make the metal element $M^2$ and the metal element $M^1$ in the first quantum dot core $M^1X^1X^2$ undergo cation exchange, and grow the second quantum dot core, where the composition of the second quantum dot core may be $M^1_cM^2_{1-c}X^1X^2$, where $0.4<c<0.9$. The precursor of the metal element $M^2$ may be added to the second quantum dot core $M^1_cM^2_{1-c}X^1X^2$ growth reaction system again. As such, the metal element $M^2$ and the metal element $M^1$ in the second quantum dot core $M^1_cM^2_{1-c}X^1X^2$ undergo cation exchange, and grow the third quantum dot core. The composition of the third quantum dot core may be $M^1_dM^2_{1-d}X^1X^2$, where $0<d<0.9$, $d<c$.

In some embodiments, the metal element $M^1$ may be Ga, and the metal element $M^2$ may be In.

In some embodiments, the metal element $M^1$ may be Zn, and the metal element $M^2$ may be Cd.

Generally, the energy band gap such as InP, CdS, and CdSe are relatively narrow and the Bohr radius is relatively large, making it difficult to prepare quantum dots with short emission wavelength (such as blue). Through the conventional method of alloying quantum dots, metal elements with a wide band gap such as Ga or Zn can be added at the same time during preparation. However, since the reactivity of these metal elements is much lower than that of In or Cd, and the conventional method of alloying quantum dots can only adjust the component distribution by changing the feeding amount, the composition distribution of Ga or Zn can only be effectively formed in the alloyed quantum dots when the feeding amount of Ga or Zn is much higher than that of In or Cd. This greatly limits the adjustable range of the distribution of each element composition, and the performance of the quantum dots formed cannot be optimized. In this optimized implementation, by using sufficient condition optimization, $M^1$ with a relatively small ionic radius (i.e., low activity) is formed into a high-quality $M^1X^1$ binary compound first quantum dot core, and $M^2$ with a relatively large ionic radius (i.e., high activity) is added for cation exchange. At this time, the component distribution of highly active $M^2$ can be adjusted not only by changing the relative feeding amount, but also by controlling various reaction conditions such as the timing of $M^2$ addition, reaction temperature, cation exchange reaction time, etc. As such, a sufficient space may be provided for component distribution control and final quantum dot optimization, and the preparation of short-wave quantum dots based on InP and CdSe alloy systems may be realized, thereby expanding the coverage of the emission wavelength. At this time, the metal element $M^2$ corresponding to the narrow energy band gap is alloyed into the original first quantum dot core, as such, the second quantum dot core may be red-shifted in wavelength compared to the original first quantum dot core.

In some embodiments, the metal element $M^1$ may be Cd, and the metal element $M^2$ may be Zn.

In some embodiments, the metal element $M^1$ may be In, and the metal element $M^2$ may be Ga.

In CdS, CdSe, and InP, since the relatively of the metal elements and non-metal elements are relatively high and the corresponding Bohr radius is relatively large, the reaction rate may be relative fast during core forming. The reaction kinetics for the formed CdSe and InP core can be difficult to control, which can cause uneven size distribution, as such, the quantum dot may have a wide emission peak width. The conventional alloying method adds metal elements with relatively small ionic radius (i.e., low activity) at the same time. However, since the reaction activity is weak, there is nearly no improvement in the reaction kinetics. As such, the above-mentioned problem of the emission peak width cannot be solved. In this optimized embodiment, $M^2$ with a relatively small ionic radius (i.e., low reactivity) is added to the first quantum dot core of the already formed $M^1X^1$ binary compound with a narrow energy band gap for cation exchange reaction. The controllable cation exchange reaction can effectively improve the size and component uniformity of quantum dots, thereby effectively narrowing emission peak width of the quantum dots. At the same time, due to the alloying of the metal element $M^2$ corresponding to the wide energy band gap into the original first quantum dot core, the effective Bohr radius of the first quantum dot core may be decreased, that is, the quantum size effect under the same size may be weakened, which also helps to further reduce the emission peak width of the quantum dots. Due to the alloying of the metal element $M^2$ corresponding to the wide energy band gap into the original first quantum dot core, the emission peak wavelength of the second quantum dot core may be blue-shifted compared to the original first quantum dot core.

In this embodiment, the metal element $M^1$ and the metal element $M^2$ may be different, and the non-metal element $X^1$ and the non-metal element $X^2$ may be different. The selections of the metal element $M^1$, the metal element $M^2$, the non-metal element $X^1$, and the non-metal element $X^2$ are described above, and will not be repeated here.

Although the method provided in the embodiments of the present disclosure provides more room for adjusting the component distribution, which can be adjusted either by changing the feeding ratio of metal elements and non-metal elements, or adjusted in a more real-time, more direct, and more precise manner through each reaction condition parameter of the actual reaction process, however, the degree of the cation exchange reaction itself, that is, the space for adjusting the component distribution is still subject to various conditions and cannot be adjusted arbitrarily. The degree of cation exchange reaction is related to the driving force to promote the reaction, and this driving force is mainly determined by the concentration difference of an ion in the quantum dot and in the reaction system. Therefore, when the concentration of the metal element to be exchanged for the first time drops to a certain level after a period of reaction, no matter how the reaction temperature, reaction time, and other parameters are adjusted, the cation exchange reaction is difficult to continue (when $0.4<c<0.9$). As such, the component distribution can no longer be adjusted. Therefore, in this optimized embodiment, by adding the metal element to be exchanged twice, the concentration difference in the quantum dot and the reaction system, that is, the reaction driving force can be restored. As a result, the cation exchange reaction may continue to proceed, and the third quantum dot core composed of $M^1_dM^2_{1-d}X^1X^2$ and $M^1_dM^2_{1-d}X^1$ may be formed, and the alloy component distribution of the quantum dots can be further adjusted.

Figure 5:
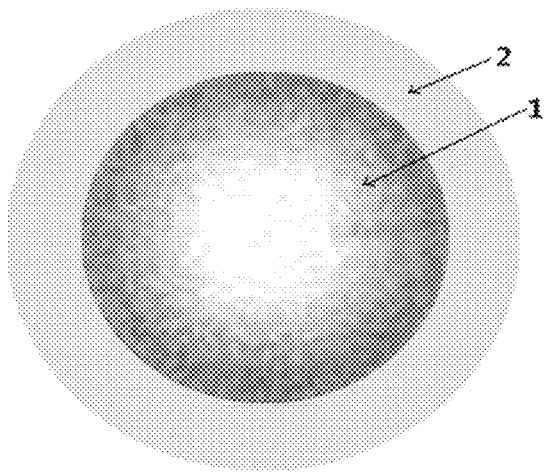
FIG. 5 is a schematic structure diagram of a quantum dot according to some embodiments of the present disclosure.

Some embodiments of the present disclosure also provide a quantum dot. As shown in FIG. 5, the quantum dot includes a quantum dot core 1 and a first semiconductor shell layer 2 covering the quantum dot core 1.

The quantum dot core 1 is composed of a metal element $M^1$, a metal element $M^2$, and a non-metal element (the content of the non-metal element is not shown).

In the quantum dot core 1, the content of the metal element $M^2$ gradually increases from inside out along the radius direction of the quantum dot (the black portion in FIG. 5 indicates the content of $M^2$), and the content of the metal element $M^1$ gradually decreases from inside out (the white portion in FIG. 5 indicates the content of $M^1$).

In some embodiments, the quantum dot core may be composed of metal element $M^1$, metal element $M^2$, and non-metal element $X^1$. In some specific embodiments, the metal element $M^1$ and the metal element $M^2$ may be different. The metal element $M^1$ and the metal element $M^2$ may be independently selected from one or Zn, Cd, Hg, Al, In, and Ga, and the non-metal element $X^1$ may be selected from one of S, Se, Te, N, P, and As.

In some embodiments, the material of the first semiconductor shell layer may be selected from group II-VI semiconductor materials or group III-V semiconductor materials.

In some embodiments, the wavelength range of the emission peak of the quantum dots may be 380-700 nm, and the half-peak width of the emission peak of the quantum dots may be 12-80 nm.

Figure 6:
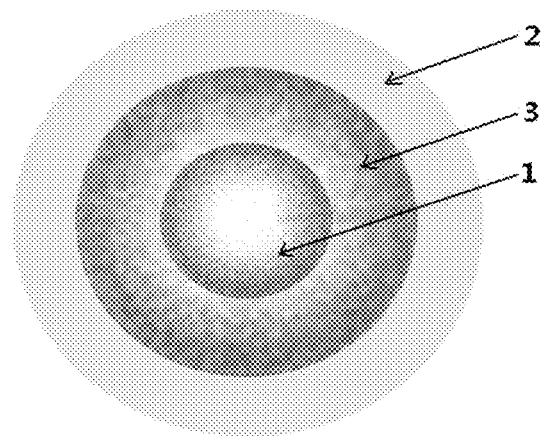
FIG. 6 is a schematic structure diagram of a quantum dot according to other embodiments of the present disclosure.

In some embodiments, as shown in FIG. 6, a second semiconductor shell layer 3 is also formed between the quantum dot core 1 and the first semiconductor shell layer 2. The second semiconductor shell layer 3 covers the quantum dot core 1, and the first semiconductor shell layer 2 covers the second semiconductor shell layer 3. The second semiconductor shell layer 3 is composed of a metal element $M^3$, a metal element $M^4$, and a non-metal element (the content of the non-metal element is not shown).

In the second semiconductor shell layer 2, the content of the metal element $M^4$ gradually increases from inside out along the radius direction of the quantum dot (the black portion in FIG. 6 indicates the content of $M^4$), and the content of the metal element $M^3$ gradually decreases from inside out (the white portion in FIG. 6 indicates the content of $M^3$).

In some embodiments, the second semiconductor shell layer may be composed of metal element $M^3$, metal element $M^4$, and non-metal element $X^3$. The metal element $M^3$ and the metal element $M^4$ may be different. The metal element $M^3$ and the metal element $M^4$ may be independently selected from one or Zn, Cd, Hg, Al, In, and Ga, and the non-metal element $X^3$ may be selected from one of S, Se, Te, N, P, and As.

In some embodiments, the wavelength range of the emission peak of the quantum dots may be 380-700 nm, and/or the half-peak width of the emission peak of the quantum dots may be 12-80 nm.

Some embodiments of the present disclosure also provide an application of quantum dots, in which the quantum dots may be used as functional materials for preparing semiconductor devices. The semiconductor device may be any one of an electroluminescent device, a photoluminescent device, a solar cell, a display device, a photodetector, a biological probe, and a nonlinear optical device.

Taking the electroluminescent device as an example, the quantum dots provided by the embodiments of the present disclosure may be used to prepare the light-emitting layer of the electroluminescent device, and the obtained quantum dots electroluminescent device can achieve excellent performances such as efficient charge injection, high luminous brightness, low driving voltage, and high device efficiency. At the same time, the quantum dot materials provided by the embodiments of the present disclosure may also have the characteristics of easy control and diverse energy level structures, which can fully satisfy and cooperate with the energy level structures of other functional layers in the electroluminescent device. As such, the matching of the overall energy level structure of the device may be achieved, which may be helpful in realizing an efficient and stable semiconductor device.

The photoluminescent device may refer to a device that relies on an external light source to irradiate to obtain energy and generate excitation to cause light emission. Ultraviolet radiation, visible light, and infrared can all cause photoluminescent, such as phosphorescence and fluorescence. The quantum dots according to the embodiments of the present disclosure can be used as light-emitting materials for photoluminescent device.

The solar cell may also be called a photovoltaic device, and the quantum dots according to the embodiments of the present disclosure can be used as a light absorbing material of a solar cell to effectively improve various performances of the photovoltaic device.

The display device may refer to a backlight module or a display panel applying the backlight module. The display panel can be applied to various products, such as a display, a tablet computer, a mobile phone, a notebook computer, a flat-screen TV, a wearable display device, or other products including display panels of different sizes.

The photodetector may refer to a device that can convert an optical signal into an electrical signal. Its principle is that the conductivity of the irradiated material may change due to radiation. The application of quantum dot materials in photodetectors has the following advantages: sensitive to normal incident light, high photoconductive response, high specific detection rate, continuously adjustable detection wavelength, and low preparation temperature. During the operation of the photodetector of this structure, the photo-generated electron-hole pairs generated after the quantum dot photosensitive layer absorbs photons can be separated under the action of the built-in electric field. As such, the photodetector of this structure may be easy to control, have a lower driving voltage, and work under low applied bias or even zero applied bias.

The biological probe may refer to a device that modifies a certain type of material such that the biological probe may have a labeling function. For example, the quantum dots of the present disclosure may be covered to form a fluorescent probe, which may be used in the field of cell imaging or substance detection. Compared with the conventional organic fluorescent dye probe, the biological probe prepared by the quantum dot material of the present disclosure has the characteristics of high fluorescence intensity, good chemical stability, and strong photo-bleaching resistance, and has a wide range of use.

The nonlinear optical device may belong to the field of optical laser technology, which has numerous applications, such as electro-optical switch and laser modulation for laser frequency conversion and laser frequency tuning. Further, the nonlinear optical device may be used to perform optical information processing to improve imaging quality and beam quality. Furthermore, the nonlinear optical device may be used as a nonlinear etalon and bi-stable device. In addition, the nonlinear optical device may be used to study the high-excitation states and high-resolution spectra of substances, as we as the internal energy and excitation transfer processes and other relaxation processes.

The embodiments of the present disclosure will be described in detail below through a few embodiments.

First Embodiment: Preparation of CdZnS/ZnS Quantum Dots.

Add 1 mmol of cadmium oxide (CdO), 3 mL of oleic acid (OA), and 5 mL of ocatadecene (ODE) to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 1.8 mmol sulfur (S) powder and 3 mL of ODE into the reaction system.

After stirring the reaction at 300 degrees for 5 seconds, quickly inject a mixed solution of 9 mmol of zinc acetate (ZnAc2), 6 mL of OA, and 10 mL of ODE into the reaction system, and raise the temperature to 310 degrees for 15 minutes. The color of the solution was found to be lighter during the reaction, indicating that the emission wavelength of the quantum dots has gradually shifted towards blue.

Quickly inject a mixed solution of 6 mmol of S and 3 mL of trioctylphosphine (TOP) into the reaction system, and maintain the reaction at 310 degrees for 30 minutes.

At the end of reaction, CdNzS/ZnS quantum dots with alloy cores with the emission peak wavelength of 475 nm, peak width of 24 nm, and quantum yield of quantum dot solution of 60% are obtained.

Second Embodiment: Preparation of $Cd_xZn_{1-x}S/Cd_yZn_{1-y}S/ZnS$ Quantum Dots (x>y).

Add 1 mmol of cadmium oxide (CdO), 3 mL of oleic acid (OA), and 5 mL of ocatadecene (ODE) to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 1.8 mmol sulfur (S) powder and 3 mL of ODE into the reaction system.

After stirring the reaction at 300 degrees for 5 seconds, quickly inject a mixed solution of 9 mmol of zinc acetate (ZnAc2), 6 mL of OA, and 10 mL of ODE into the reaction system, and raise the temperature to 310 degrees for 15 minutes. The color of the solution was found to be lighter during the reaction, indicating that the emission wavelength of the quantum dots has gradually shifted towards blue.

Quickly inject a mixed solution of 2.0 mmol of sulfur (S) powder and 4 mL of TOP into the reaction system. Stir the reaction at 310 degrees for 1 minute, then continuously inject a mixed solution of 1 mmol CdO and 4 mL of OA into the reaction system for 10 minutes.

Quickly inject a mixed solution of 4.0 mmol of sulfur (S) powder and 2 mL of TOP into the reaction system, and maintain the reaction at 310 degrees for 30 minutes.

At the end of reaction, $Cd_xZn_{1-x}S/Cd_yZn_{1-y}S/ZnS$ quantum dots with alloy cores and alloy shells with the emission peak wavelength of 462 nm, peak width of 19 nm, and quantum yield of quantum dot solution of 72% are obtained Third Embodiment: Preparation of CdZnS/ZnS Quantum Dots.

Add 9 mmol of ZnAc2, 6 mL of OA, and 10 mL of ODE to a 100 mL three-necked flask, and exhaust at 150 degrees for 30 minutes to remove water and oxygen from the reaction system.

After the reaction system is filled with argon, raise the temperature to 250 degrees.

Quickly inject a mixed solution of 1.5 mmol sulfur (S) powder and 3 mL of ODE into the reaction system.

After stirring the reaction at 250 degrees for 20 seconds, quickly inject a mixed solution of 1.5 mmol of CdO, 4 mL of OA, and 10 mL of ODE into the reaction system, and raise the temperature to 300 degrees for 20 minutes. The color of the solution was found to be darker during the reaction, indicating that the emission wavelength of the quantum dots has gradually shifted towards red.

Quickly inject a mixed solution of 6 mmol of S and 3 mL of trioctylphosphine (TOP) into the reaction system, and maintain the reaction at 300 degrees for 30 minutes.

At the end of reaction, CdNzS/ZnS quantum dots with alloy cores with the emission peak wavelength of 455 nm, peak width of 20 nm, and quantum yield of quantum dot solution of 71% are obtained.

Fourth Embodiment: Preparation of InGaP/ZnS Quantum Dots.

Add 0.24 mmol of indium acetate, 0.17 mmol of gallium chloride, 0.8 mmol of zinc acetate, 2.8 mL of oleic acid, and 4 mL octadecene to 1 50 mL three-necked flask, and exhaust at 150 degrees for 30 minutes to remove water and oxygen from the reaction system.

After the reaction system is filled with argon, raise the temperature to 300 degrees.

Quickly inject a mixed solution of 0.19 mmol $P(TMS)_3$ (tris-trimethylsilyl phosphine) and 0.5 mL of octadecene into the reaction system.

After reacting at 300 degrees for 5 minutes, quickly inject a mixed solution of 0.08 mmol of gallium chloride, 1.5 mL of oleic acid, and 4 mL of octadecene into the reaction system, and maintain the reaction at 300 degrees for 10 minutes.

Quickly inject 1.2 mmol of dodecyl mercaptan and 2 mmol of zinc oleate into the reaction system at a uniform rate within 30 minutes.

At the end of reaction, CdNzS/ZnS quantum dots with alloy cores with the emission peak wavelength of 612 nm, peak width of 65 nm, and quantum yield of quantum dot solution of 37% are obtained.

Fifth Embodiment: Preparation of CdZnS/ZnS Quantum Dots.

Add 1 mmol of cadmium oxide (CdO), 9 mmol of zinc acetate (ZnAc2), 9 mL of oleic acid (OA), and 15 mL of ocatadecene (ODE) to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 1.8 mmol sulfur (S) powder and 3 mL of ODE into the reaction system.

After stirring the reaction at 300 degrees for 15 minutes, quickly inject a mixed solution of 1 mmol of CdO and 4 mL of OA into the reaction system, and raise the temperature to 310 degrees for 10 minutes. The color of the solution was found to be darker during the reaction, indicating that the emission wavelength of the quantum dots has gradually shifted towards red.

Quickly inject a mixed solution of 8 mmol of sulfur (S) powder and 4 mL of TOP into the reaction system, and maintain the reaction at 310 degrees for 30 minutes.

At the end of reaction, CdNzS/ZnS quantum dots with alloy cores with the emission peak wavelength of 455 nm, peak width of 18 nm, and quantum yield of quantum dot solution of 75% are obtained.

Sixth Embodiment: Preparation of CdZnSe/ZnS Quantum Dots.

Add 10 mmol of ZnAc2, 20 mL of OA, and 10 mL of ODE to a 100 mL three-necked flask, and exhaust at 150 degrees for 30 minutes to remove water and oxygen from the reaction system.

After the reaction system is filled with argon, raise the temperature to 280 degrees.

Quickly inject a mixed solution of 3.0 mmol of selenium (Se) powder and 4 mL of TOP into the reaction system.

After stirring the reaction at 280 degrees for 10 seconds, quickly inject a mixed solution of 3.0 mmol of CdO and 2 mL of OA into the reaction system, and maintain the reaction at 280 degrees for 10 minutes. The color of the solution was found to be darker during the reaction, indicating that the emission wavelength of the Quantum Dots has gradually shifted towards red.

Quickly inject a mixed solution of 4 mmol of S and 3 mL of trioctylphosphine (TOP) into the reaction system, and maintain the reaction at 280 degrees for 30 minutes.

At the end of reaction, CdNzSe/ZnS quantum dots with alloy cores with the emission peak wavelength of 519 nm, peak width of 25 nm, and quantum yield of quantum dot solution of 68% are obtained.

Seventh Embodiment: Preparation of CdZnSe/ZnS Quantum Dots.

Add 10 mmol of ZnAc2, 20 mL of OA, and 10 mL of ODE to a 100 mL three-necked flask, and exhaust at 150 degrees for 30 minutes to remove water and oxygen from the reaction system.

After the reaction system is filled with argon, raise the temperature to 280 degrees.

Quickly inject a mixed solution of 3.0 mmol of selenium (Se) powder and 4 mL of TOP into the reaction system.

After stirring the reaction at 280 degrees for 10 seconds, quickly inject a mixed solution of 3.0 mmol of CdO and 2 mL of OA into the reaction system, and maintain the reaction at 280 degrees for 10 minutes. The color of the solution was found to be darker during the reaction, indicating that the emission wavelength of the quantum dots has gradually shifted towards red.

Quickly inject a mixed solution of 0.8 mmol of CdO and 3 mL of OA into the reaction system, and raise the temperature to 300 degrees to react for 10 minutes.

Quickly inject a mixed solution of 4 mmol of S and 3 mL of trioctylphosphine (TOP) into the reaction system, and maintain the reaction at 300 degrees for 30 minutes.

At the end of reaction, CdZnSe/ZnS quantum dots with alloy cores with the emission peak wavelength of 532 nm, peak width of 27 nm, and quantum yield of quantum dot solution of 65% are obtained.

Eighth Embodiment: Preparation of CdZnSe/CdZnS/ZnS Quantum Dots.

Add 12 mmol of ZnAc2, 15 mL of OA, and 15 mL of ODE to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 3.0 mmol of selenium (Se) powder and 4 mL of TOP into the reaction system.

After stirring the reaction at 300 degrees for 10 seconds, quickly inject a mixed solution of 0.35 mmol of CdO and 2 mL of OA into the reaction system, and maintain the reaction at 300 degrees for 20 minutes. The color of the solution was found to be darker during the reaction, indicating that the emission wavelength of the quantum dots has gradually shifted towards red.

Quickly inject a mixed solution of 2 mmol of S and 3 mL of trioctylphosphine (TOP) into the reaction system, and raise the temperature to 300 degrees to react for 10 minutes.

After stirring the reaction at 300 degrees for 1 minute, quickly inject a mixed solution of 0.3 mmol of CdO and 2 mL of OA into the reaction system. Raise the temperature to 310 degrees and react for 20 minutes.

Quickly inject a mixed solution of 3 mmol of S and 2 mL of trioctylphosphine (TOP) into the reaction system, and maintain the reaction at 310 degrees for 30 minutes.

At the end of reaction, CdZnSe/CdZnS/ZnS quantum dots with alloy cores and alloy shells with the emission peak wavelength of 522 nm, peak width of 28 nm, and quantum yield of quantum dot solution of 61% are obtained.

Ninth Embodiment: Preparation of CdZnSe/ZnS Quantum Dots.

Add 14 mmol of ZnAc2, 20 mL of OA, and 10 mL of ODE to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 2.7 mmol of selenium (Se) powder and 4 mL of TOP into the reaction system.

After stirring the reaction at 300 degrees for 30 seconds, quickly inject a mixed solution of 3.0 mmol of CdO and 2 mL of OA into the reaction system, and maintain the reaction at 300 degrees for 20 minutes. The color of the solution was found to be darker during the reaction, indicating that the emission wavelength of the quantum dots has gradually shifted towards red.

Quickly inject a mixed solution of 4 mmol of Se and 3 mL of trioctylphosphine (TOP) into the reaction system, and maintain the reaction at 300 degrees for 30 minutes.

At the end of reaction, CdZnSe/ZnSe quantum dots with alloy cores with the emission peak wavelength of 471 nm, peak width of 21 nm, and quantum yield of quantum dot solution of 52% are obtained.

Tenth Embodiment: Preparation of CdZnSeS/ZnS Quantum Dots (Using the Conventional Method to Compare Results).

Add 0.4 mmol of CdO, 4 mmoL of ZnAc2, 7 mL of OA, and 15 mL of ODE to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 0.01 mmol of selenium (Se) powder, 4 mmol S, and 4 mL of TOP into the reaction system.

React for 10 minutes at 300 degrees.

At the end of reaction, CdZnSeS/ZnS quantum dots with alloy cores with the emission peak wavelength of 485 nm, peak width of 36 nm, and quantum yield of quantum dot solution of 38% are obtained.

Eleventh Embodiment: Preparation of CdZnSeS/ZnSeS Quantum Dots.

Add 0.4 mmol of CdO, 6 mmoL of ZnAc2, 7 mL of OA, and 15 mL of ODE to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 0.9 mmol of selenium (Se) powder, 0.2 mmol S, and 4 mL of TOP into the reaction system.

React for 10 minutes at 300 degrees.

Inject a mixed solution of 1.2 mmol of CdO and 4 mL of OA into the reaction system, and react at 300 degrees for 15 minutes.

Quickly inject a mixed solution of 3 mmol of S, 1 mol of Se, and 2 mL of trioctylphosphine (TOP) into the reaction system, and maintain the reaction at 310 degrees for 30 minutes.

At the end of reaction, CdZnSeS/ZnSeS quantum dots with alloy cores with the emission peak wavelength of 682 nm, peak width of 31 nm, and quantum yield of quantum dot solution of 46% are obtained.

Twelfth Embodiment: Preparation of CdZnSe/ZnSeS Quantum Dots.

Add 1 mmol of CdO, 10 mL of OA, and 10 mL of ODE to a 100 mL three-necked flask, and exhaust at 150 degrees for 30 minutes to remove water and oxygen from the reaction system.

After the reaction system is filled with argon, raise the temperature to 300 degrees.

Quickly inject a mixed solution of 1.8 mmol of selenium (Se) powder and 4 mL of TOP into the reaction system.

After stirring the reaction at 300 degrees for 5 seconds, quickly inject a mixed solution of 10 mmol of ZnAc2, 10 mL of OA, and 10 mL of ODE into the reaction system, and maintain the reaction at 300 degrees for 10 minutes. The color of the solution was found to be lighter during the reaction, indicating that the emission wavelength of the quantum dots has gradually shifted towards blue.

Quickly inject a mixed solution of 3.5 mmol of Se, 1.5 mmol of S, and 5 mL of trioctylphosphine (TOP) into the reaction system, and maintain the reaction at 300 degrees for 60 minutes.

At the end of reaction, CdZnSe/ZnSeS quantum dots with alloy cores with the emission peak wavelength of 617 nm, peak width of 22 nm, and quantum yield of quantum dot solution of 47% are obtained.

Thirteenth Embodiment: Preparation of InGaP/ZnS Quantum Dots.

Add 0.24 mmol of indium acetate, 0.5 mmol of zinc acetate, 2.8 mL of oleic acid, and 4 mL of octadecene to a 50 mL three-necked flask, and exhaust at 150 degrees for 30 minutes to remove water and oxygen from the reaction system.

After the reaction system is filled with argon, raise the temperature to 300 degrees.

Quickly inject a mixed solution of 0.19 mmol of P(TMS)$_3$ (tris-trimethylsilyl phosphine) and 0.5 mL of octadecene into the reaction.

After reacting at 300 degrees for 20 seconds, quickly inject a mixed solution of 0.17 mmol of gallium chloride, 1.5 mL of oleic acid, and 4 mL of octadecene into the reaction system, and maintain the reaction at 300 degrees for 10 minutes.

Inject 1.2 mmol of dodecyl mercaptan and 2 mmol of zinc oleate into the reaction system at a uniform rate within 30 minutes.

At the end of reaction, InGaP/ZnS quantum dots with alloy cores with the emission peak wavelength of 605 nm, peak width of 62 nm, and quantum yield of quantum dot solution of 40% are obtained.

Fourteenth Embodiment: Positive Bottom-Emitting Quantum Dot Light-Emitting Diode Device.

Figure 7:
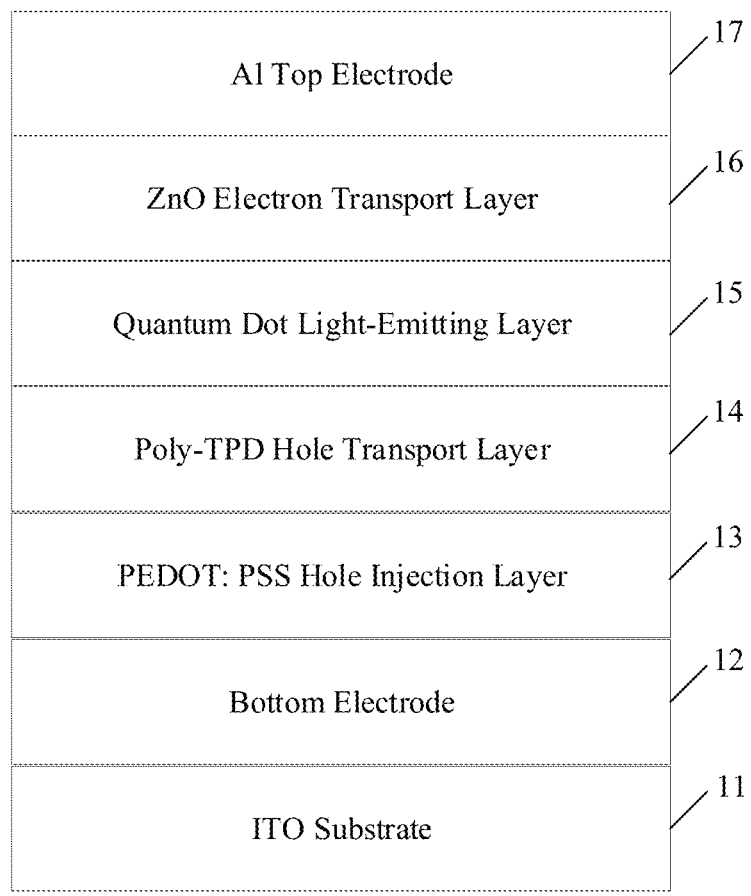
FIG. 7 is a schematic view of a structure of a positive bottom-emitting QLED device in the fourteenth embodiment.

As shown in FIG. 7, the quantum dot light-emitting diode of this embodiment includes, in order from bottom to top: an ITO substrate 11, a bottom electrode 12, a PEDOT: PSS hole injection layer 13, a poly-TPD hole transport layer 14, a quantum dot light-emitting layer 15, a ZnO electron transport layer 16, and an Al top electrode 17.

The preparation steps of the above quantum dot light-emitting diode are as follow.

After sequentially preparing the bottom electrode 12, 30 nm of PEDOT: PSS hole injection layer 13, and 30 nm of poly-TPD hole transport layer 14 on the ITO substrate 11 in sequence, the quantum dot light-emitting layer 15 with a thickness of 20 nm is prepared on the poly-TPD hole transport layer 14. Subsequently, a 40 nm of ZnO electron transport layer 16 and a 100 nm of Al top electrode 17 are prepared on the quantum dot light-emitting layer 15. The material of the quantum dot light-emitting layer 15 may be the quantum dots as described in the First Embodiment.

Fifteenth Embodiment: Positive Bottom-Emitting Quantum Dot Light-Emitting Diode Device.

Figure 8:
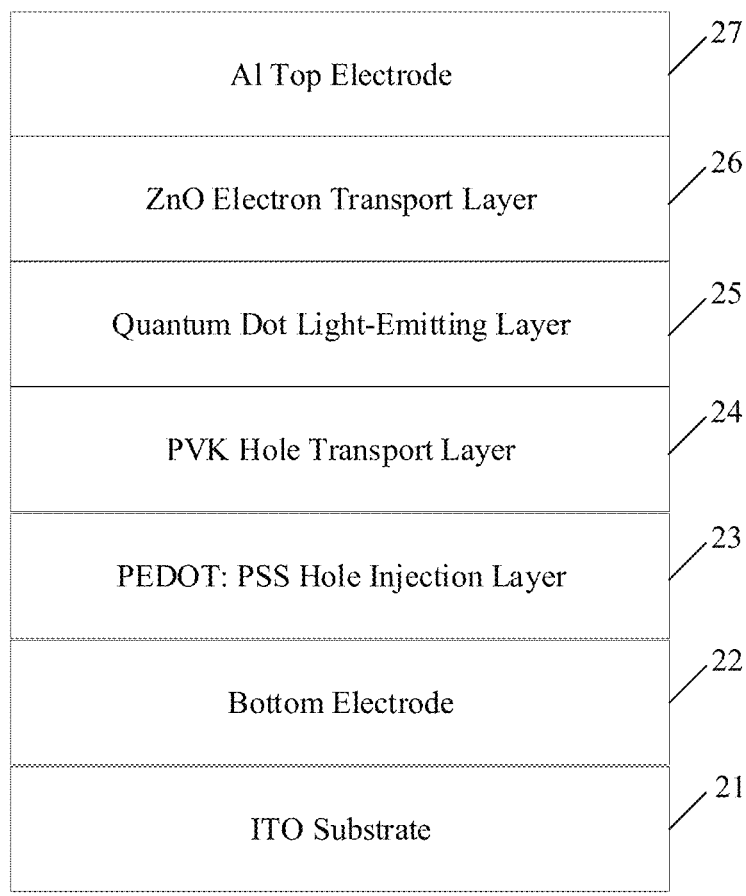
FIG. 8 is a schematic view of a structure of a positive bottom-emitting QLED device in fifteenth embodiment.

As shown in FIG. 8, the quantum dot light-emitting diode of this embodiment includes, in order from bottom to top: an ITO substrate 21, a bottom electrode 22, a PEDOT: PSS hole injection layer 23, a poly(9-vinylcarbazole) (PVK) hole transport layer 24, a quantum dot light-emitting layer 25, a ZnO electron transport layer 26, and an Al top electrode 27.

The preparation steps of the above quantum dot light-emitting diode are as follow.

After sequentially preparing the bottom electrode 22, 30 nm of PEDOT: PSS hole injection layer 23, and 30 nm of PVK hole transport layer 24 on the ITO substrate 21 in sequence, the quantum dot light-emitting layer 25 with a thickness of 20 nm is prepared on the PVK hole transport layer 24. Subsequently, a 40 nm of ZnO electron transport layer 26 and a 100 nm of Al top electrode 27 are prepared on the quantum dot light-emitting layer 25. The material of the quantum dot light-emitting layer 25 may be the quantum dots as described in the Second Embodiment.

Sixteenth Embodiment: Inverted Bottom-Emitting Quantum Dot Light-Emitting Diode Device.

Figure 9:
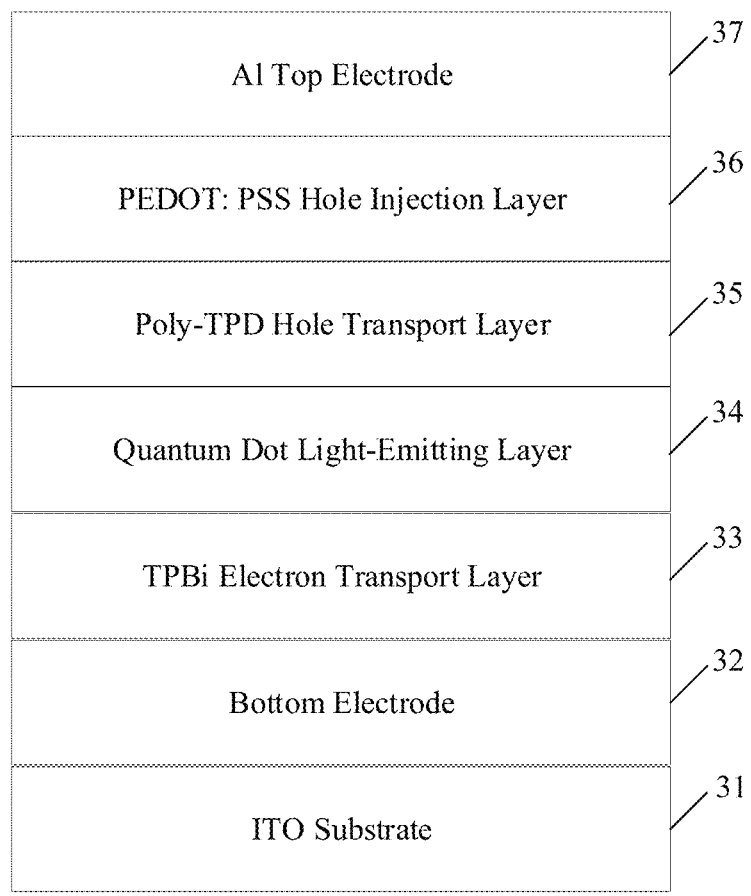
FIG. 9 is a schematic view of a structure of an inverted bottom-emitting QLED device in the sixteenth embodiment.

As shown in FIG. 9, the quantum dot light-emitting diode of this embodiment includes, in order from bottom to top: an ITO substrate 31, a bottom electrode 32, a TPBi electron transport layer 33, a quantum dot light-emitting layer 34, a poly-TPD hole transport layer 35, a PEDOT: PSS hole injection layer 36, and an Al top electrode 37.

The preparation steps of the above quantum dot light-emitting diode are as follow.

The bottom electrode 32 and the TPBi electron transport layer 33 with a thickness of 30 nm are prepared on the ITO substrate 31 in sequence, and the quantum dot light-emitting layer 34 with a thickness of 20 nm is prepared on the TPBi electron transport layer 33. Subsequently, a 30 nm of poly-TPD hole transport layer 35, a 30 nm of PEDOT: PSS hole injection layer 36, and a 100 nm of Al top electrode 37 are prepared by using a vacuum evaporation method. The material of the quantum dot light-emitting layer 34 may be the quantum dots as described in the Third Embodiment.

Seventeenth Embodiment: Inverted Bottom-Emitting Quantum Dot Light-Emitting Diode Device.

Figure 10:
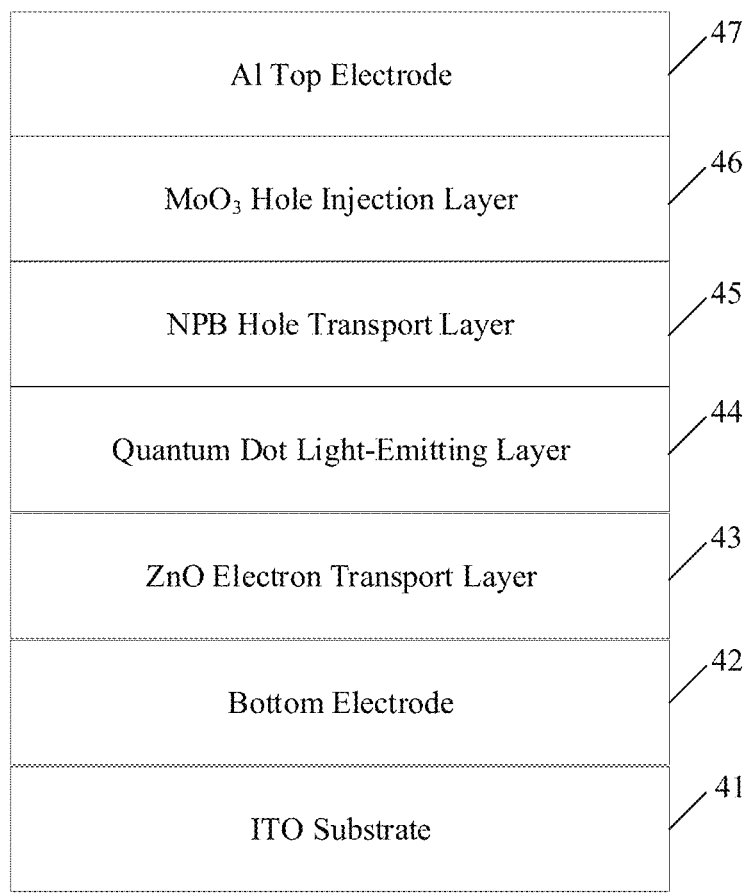
FIG. 10 is a schematic view of a structure of an inverted bottom-emitting QLED device in the seventeenth embodiment.

As shown in FIG. 10, the quantum dot light-emitting diode of this embodiment includes, in order from bottom to top: an ITO substrate 41, a bottom electrode 42, a ZnO electron transport layer 43, a quantum dot light-emitting layer 34, a NPB hole transport layer 45, a MoO$_3$ hole injection layer 46, and an Al top electrode 47.

The preparation steps of the above quantum dot light-emitting diode are as follow.

The bottom electrode 42 and the ZnO electron transport layer 43 with a thickness of 40 nm are prepared on the ITO substrate 41 in sequence, and the quantum dot light-emitting layer 44 with a thickness of 20 nm is prepared on the ZnO electron transport layer 43. Subsequently, a 30 nm of NPB hole transport layer 45, a 5 nm of MoO$_3$ hole injection layer 46, and a 100 nm of Al top electrode 47 are prepared by using the vacuum evaporation method. The material of the quantum dot light-emitting layer 44 may be the quantum dots as described in the Fourth Embodiment.

Eighteenth Embodiment: Positive Top-Emitting Quantum Dot Light-Emitting Diode Device.

Figure 11:
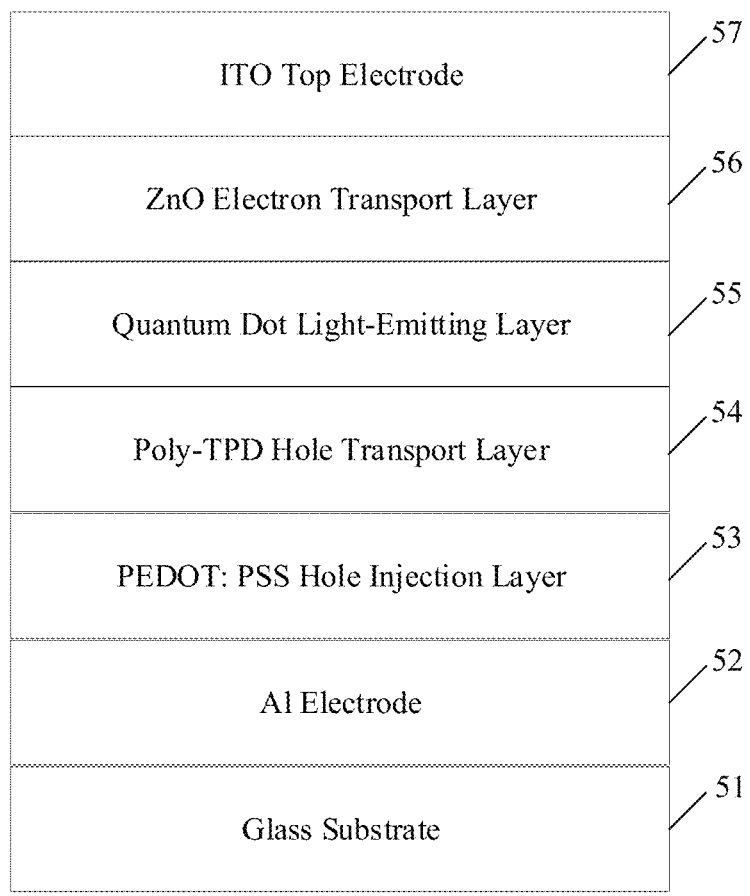
FIG. 11 is a schematic view of a structure of a positive top-emitting QLED device in the eighteenth embodiment.

As shown in FIG. 11, the quantum dot light-emitting diode of this embodiment includes, in order from bottom to top: a glass substrate 51, an Al electrode 52, a PEDOT: PSS hole injection layer 53, a poly-TPD hole transport layer 54, a quantum dot light-emitting layer 55, a ZnO electron transport layer 56, and an ITO top electrode 57.

The preparation steps of the above quantum dot light-emitting diode are as follow.

After a 100 nm of Al electrode 52 is prepared on the glass substrate 51 by using the vacuum evaporation method, a 30 nm of PEDOT: PSS hole injection layer 53 and 1 30 nm ploy-TPD hole transport layer 54 are prepared in sequence. A 20 nm of quantum dot light-emitting layer 55 is prepared on the poly-TPD hole transport layer 54. Subsequently, a 40 nm of ZnO electron transport layer 56 is prepared on the quantum dot light-emitting layer 55, and finally a 120 nm of ITO is prepared as the top electrode 57 by using a sputtering method. The material of the quantum dot light-emitting layer 55 may be the quantum dots as described in the Seventh Embodiment.

Nineteenth Embodiment: Positive Top-Emitting Quantum Dot Light-Emitting Diode Device.

Figure 12:
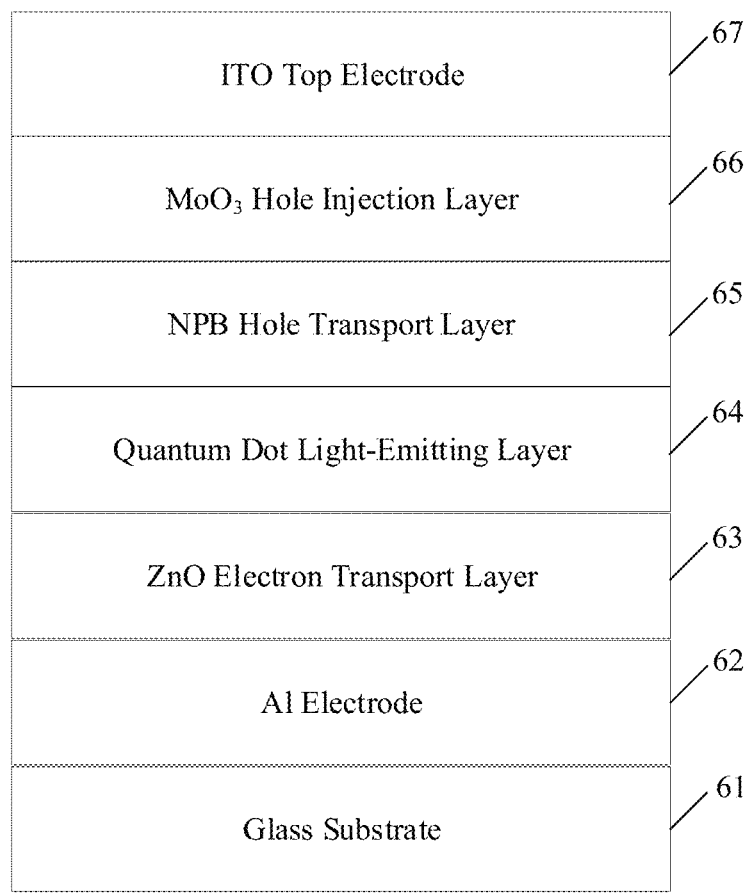
FIG. 12 is a schematic view of a structure of an inverted top-emitting QLED device in the nineteenth embodiment.

As shown in FIG. 12, the quantum dot light-emitting diode of this embodiment includes, in order from bottom to top: a glass substrate 61, an Al electrode 62, a ZnO electron transport layer 63, a quantum dot light-emitting layer 64, a NPB hole transport layer 65, a MoO₃ hole injection layer 66, and an ITO top electrode 67.

The preparation steps of the above quantum dot light-emitting diode are as follow.

A 100 nm of Al electrode 62 is prepared on the glass substrate 61 by using the vacuum evaporation method, then a 40 nm of ZnO electron transport layer 63 and a 20 nm of quantum dot light-emitting layer 64 are prepared in sequence. Subsequently, a 30 nm of NPB hole transport layer 66 and a 5 nm of MoO3 hole injection layer 66 are prepared by the vacuum evaporation method, and finally a 120 nm of ITO is prepared as the top electrode 67 by using the sputtering method. The material of the quantum dot light-emitting layer 64 may be the quantum dots as described in the Ninth Embodiment.

In summary, the embodiments of the present disclosure provide a new method for preparing quantum dots with alloy cores. In this method, the distribution of alloyed component can be adjusted not only by changing the feeding ratio of the metal elements and the non-metal elements, but also by a more real-time, more direct, and more precise adjustments through the reaction condition parameters of the actual reaction process, thereby achieving a more precise composition and energy level distribution control for alloyed quantum dots.

It should be understood that the application of the present disclosure is not limited to the above examples. For those of ordinary skilled in the art, improvements or changes can be made based on the above description, and all of such improvements and changes should fall within the protection scope of the appended claims of the present disclosure.

What is claimed is:

1. A quantum dot preparation method, comprising:
   providing a first quantum dot core growth reaction system, precursors in the first quantum dot core growth reaction system including metal element precursors and non-metal element precursors, the metal element precursors including at least a metal element $M^1$ precursor, and the metal element in the first quantum dot core including at least the metal element $M^1$;
   adding a precursor of a metal element $M^2$ to the first quantum dot core growth reaction system during the growth process of the first quantum dot core;
   interrupting the growth of the first quantum dot core to make the metal element $M^2$ and the metal element $M^1$ in the first quantum dot core exchange cations to grow a second quantum dot core;
   adding a precursor of a metal element $M^3$ and a precursor of a non-metal element $X^3$ during the growth process of the second quantum dot core;
   interrupting the growth of the second quantum dot core and grow a third semiconductor shell layer $M^3X^3$ on the surface of the second quantum dot core;
   adding a precursor of a metal element $M^4$ during the growth process of the third semiconductor shell layer;
   interrupting the growth of the third semiconductor shell layer $M^3X^3$ to make the metal element $M^4$ and the metal element $M^3$ in the third semiconductor shell layer exchange cations to prepare a second semiconductor shell layer $M^3M^4X^3$;
   forming a first semiconductor shell layer on the surface of the second semiconductor shell layer to obtain a quantum dot,
   wherein:
      the quantum dot comprises: a quantum dot core comprising the first quantum dot core and the second quantum dot core, the first semiconductor shell layer, and the second semiconductor shell layer formed between the quantum dot core and the first semiconductor shell layer, the second semiconductor shell layer covering the quantum dot core, and the first semiconductor shell layer covering the second semiconductor shell layer; and
      in the second quantum dot core, along a radius direction of the quantum dot, wherein contents of the metal element $M^2$ increases from inside to outside, and contents of the metal element $M^1$ decreases from inside to outside.

2. The quantum dot preparation method of claim 1, wherein the metal element $M^1$ and the metal element $M^2$ are different, and the metal element $M^1$ and the metal element $M^2$ are independently selected from one of Zn, Cd, Hg, Al, In, and Ga.

3. The quantum dot preparation method of claim 2, wherein the metal element $M^1$ is Ga and the metal element $M^2$ is In; or, the metal element $M^1$ is Zn and the metal element $M^2$ is Cd; or, the metal element $M^1$ is In and the metal element $M^2$ is Ga; or, the metal element $M^1$ is Cd and the metal element $M^2$ is Zn.

4. The quantum dot preparation method of claim 1, wherein the precursors in the first quantum dot core growth reaction system include the metal element $M^1$ precursor and a non-metal element $X^1$ precursor, composition of the first quantum dot core is $M^1X^1$; and composition of the second quantum dot core is $M^1M^2X^1$.

5. The quantum dot preparation method of claim 4, wherein the non-metal element $X^1$ is selected from one of S, Se, Te, N, P, and As.

6. The quantum dot preparation method of claim 4, wherein the metal element $M^2$ has a larger ion radius than the metal element $M^1$.

7. The quantum dot preparation method of claim 6, wherein the metal element $M^1$ is Ga, the metal element $M^2$ is In, and the second quantum dot core $M^1M^2X^1$ is GaInP; or, the metal element $M^1$ is Zn, the metal element $M^2$ is Cd, and the second quantum dot core $M^1M^2X^1$ is ZnCdS or ZnCdSe.

8. The quantum dot preparation method of claim 4, wherein the metal element $M^2$ has a smaller ion radius than the metal element $M^1$.

9. The quantum dot preparation method of claim 8, wherein the metal element $M^1$ is Cd, the metal element $M^2$ is Zn, and the second quantum dot core $M^1M^2X^1$ is CdZnS or CdZnSe; or, the metal element Mi is In, the metal element $M^2$ is Ga, and the second quantum dot core $M^1M^2X^1$ is InGaP.

10. The quantum dot preparation method of claim 1, wherein the metal element precursors include the metal element $M^1$ precursor and the metal element $M^2$ precursor, and the metal element in the first quantum dot core growth reaction includes the metal element $M^1$ precursor and the metal element $M^2$.

11. The quantum dot preparation method of claim 10, wherein the precursor of the non-metal element is the non-metal element $X^1$ precursor, and the composition of the first quantum dot core is $M^1_aM^2_{1-a}X^1$, the method further comprising:

adding the precursor of the metal element $M^2$ to the first quantum dot core growth reaction system; and interrupting the growth of the first quantum dot core to make the metal element $M^2$ and the metal element $M^1$ in the first quantum dot core $M^1{}_aM^2{}_{1-a}X^1$ exchange cations to perform the growth of the second quantum dot core, the composition of the second quantum dot core being $M^1{}_bM^2{}_{1-b}X^1$, wherein $0<a<1$, $0<b<1$, and $b<a$.

12. The quantum dot preparation method of claim 11, wherein the metal element $M^1$ is Ga, the metal element $M^2$ is In, and the non-metal element $X^1$ is P; or, the metal element $M^1$ is Zn, the metal element $M^2$ is Cd, and non-metal element $X^1$ is S or Se; or, the metal element $M^1$ is Cd, the metal element $M^2$ is Zn, and non-metal element $X^1$ is S or Se.

13. The quantum dot preparation method of claim 10, wherein the precursors of the non-metal element include the non-metal element $X^1$ precursor and a non-metal element $X^2$ precursor, and the composition of the first quantum dot core is $M^1{}_aM^2{}_{1-a}X^1X^2$, the method further comprising:

adding the precursor of the metal element $M^2$ to the first quantum dot core growth reaction system; and interrupting the growth of the first quantum dot core to make the metal element $M^2$ and the metal element $M^1$ in the first quantum dot core $M^1{}_aM^2{}_{1-a}X^1X^2$ exchange cations to grow the second quantum dot core, the composition of the second quantum dot core being $M^1{}_bM^2{}_{1-b}X^1X^2$, wherein $0<a<1$, $0<b<1$, and $b<a$.

14. The quantum dot preparation method of claim 13, wherein the non-metal element $X^1$ and the non-metal element $X^2$ are different, and the non-metal element $X^1$ and the non-metal element $X^2$ are independently selected from one of S, Se, Te, N, P, and As.

15. The quantum dot preparation method of claim 1, wherein the metal element precursors include the metal element $M^1$ precursor, and the metal element in the first quantum dot core is the metal element $M^1$, the method further comprising:

adding the precursor of the metal element $M^2$ to the first quantum dot core growth reaction system during the growth process of the first quantum dot core;

interrupting the growth of the first quantum dot core to make the metal element $M^2$ and the metal element $M^1$ in the first quantum dot core exchange cations to grow the second quantum dot core, the metal element in the second quantum dot core being the metal element $M^1$ and the metal element $M^2$; and adding the precursor of the metal element $M^2$ to the second quantum dot core growth reaction system again during the growth process of the first quantum dot core to make the metal element $M^2$ and the metal element $M^1$ in the second quantum dot core exchange cations to grow a third quantum dot core.

16. The quantum dot preparation method of claim 15, wherein the precursors in the first quantum dot core growth reaction system include the metal element $M^1$ precursor and the non-metal element $X^1$ precursor, and the composition of the first quantum dot core is $M^1X^1$, the method further comprising:

adding the precursor of the metal element $M^2$ to the first quantum dot core growth reaction system;

interrupting the growth of the first quantum dot core to make the metal element $M^2$ and the metal element $M^1$ in the first quantum dot core exchange cations to grow the second quantum dot core, the composition of the second quantum dot core is $M^1{}_cM^2{}_{1-c}X^1$ wherein $0.4<c<0.9$; and adding the precursor of the metal element $M^2$ to the second quantum dot core $M^1{}_cM^2{}_{1-c}X^1$ growth reaction system again to make the metal element $M^2$ and the metal element $M^1$ in the second quantum dot core $M^1{}_cM^2{}_{1-c}X^1$ exchange cations to grow the third quantum dot core, composition of the third quantum dot core being $M^1{}_dM^2{}_{1-d}X^1$, wherein $0<d<0.9$ and $d<c$.

17. The quantum dot preparation method of claim 15, wherein the precursors of the non-metal element include the non-metal element $X^1$ precursor and the non-metal element $X^2$ precursor, and the composition of the first quantum dot core is $M^1X^1X^2$, the method further comprising:

adding the precursor of the metal element $M^2$ to the first quantum dot core growth reaction system;

interrupting the growth of the first quantum dot core to make the metal element $M^2$ and the metal element $M^1$ in the first quantum dot core $M^1X^1X^2$ exchange cations to grow the second quantum dot core, the composition of the second quantum dot core being $M^1{}_cM^2{}_{1-c}X^1X^2$, wherein $0.4<c<0.9$; and adding the precursor of the metal element $M^2$ to the second quantum dot core $M^1{}_cM^2{}_{1-c}X^1X^2$ growth reaction system again to make the metal element $M^2$ and the metal element $M^1$ in the second quantum dot core $M^1{}_cM^2{}_{1-c}X^1X^2$ exchange cations to grow the third quantum dot core, the composition of the third quantum dot core being $M^1{}_dM^2{}_{1-d}X^1X^2$ wherein $0<d<0.9$ and $d<c$.

18. The quantum dot preparation method of claim 17, wherein the non-metal element $X^1$ and the non-metal element $X^2$ are different, and the non-metal element $X^1$ and the non-metal element $X^2$ are independently selected from one of S, Se, Te, N, P, and As.

19. The quantum dot preparation method of claim 1, wherein a material of the first semiconductor shell layer is selected from Group II-IV semiconductor materials or Group III-V semiconductor materials.

20. The quantum dot preparation method of claim 1, wherein the metal element $M^3$ and the metal element $M^4$ are different, and the metal element $M^3$ and the metal element $M^4$ are independently selected from one of Zn, Cd, Hg, Al, In, and Ga; and/or the non-metal element $X^3$ is selected from one of S, Se, Te, N, P, and As.

21. The quantum dot preparation method of claim 20, wherein the metal element $M^3$ is Ga, the metal element $M^4$ is In, and the composition of the second semiconductor shell layer is GaInP; or, the metal element $M^3$ is Zn, the metal element $M^4$ is Cd, and the composition of the second semiconductor shell layer is ZnCdS or ZnCdSe; or, the metal element $M^3$ is In, the metal element $M^4$ is Ga, and the composition of the second semiconductor shell layer is GaInP; or, the metal element $M^3$ is Cd, the metal element $M^4$ is Zn, and the composition of the second semiconductor shell layer is ZnCdS or ZnCdSe.

22. A quantum dot, comprising:
a quantum dot core;
a first semiconductor shell layer covering the quantum dot core; and
a second semiconductor shell layer formed between the quantum dot core and the first semiconductor shell layer, the second semiconductor shell layer covering the quantum dot core, and the first semiconductor shell layer covering the second semiconductor shell layer;

the quantum dot core being composed of a metal element $M^1$, a metal element $M^2$, and a non-metal element; and in the quantum dot core, along a radius direction of the quantum dot, wherein contents of the metal element $M^2$ increases from inside to outside, and contents of the metal element $M^1$ decreases from inside to outside.

23. The quantum dot of claim 22, wherein the quantum dot core is composed of the metal element $M^1$, the metal element $M^2$, and a non-metal element $X^1$; the metal element $M^1$ and the metal element $M^2$ are different, and the metal element $M^1$ and the metal element $M^2$ are independently selected from one of Zn, Cd, Hg, Al, In, and Ga; and, the non-metal element $X^1$ is selected from one of S, Se, Te, N, P, and As.

24. The quantum dot of claim 23, wherein the metal element $M^1$ is Ga, the metal element $M^2$ is In, and the non-metal element $X^1$ is P; or, the metal element $M^1$ is Zn, the metal element $M^2$ is Cd, and non-metal element $X^1$ is S or Se; or, the metal element $M^1$ is Cd, the metal element $M^2$ is Zn, and non-metal element $X^1$ is S or Se.

25. The quantum dot of claim 22, wherein a material of the first semiconductor shell layer is selected from Group II-IV semiconductor materials or Group III-V semiconductor materials.

26. The quantum dot of claim 22, wherein,
the second semiconductor shell layer is composed of a metal element $M^3$, a metal element $M^4$, and the non-mental element, the metal element $M^3$ and the metal element $M^4$ are different;
in the second semiconductor shell layer, along the radius direction of the quantum dot, contents of the metal element $M^4$ increases from inside to outside, and contents of the metal element $M^3$ decreases from inside to outside.

27. The quantum dot of claim 26, wherein the metal element $M^3$ is Ga, the metal element $M^4$ is In, and the composition of the second semiconductor layer is GaInP; or, the metal element $M^3$ is Zn, the metal element $M^4$ is Cd, and the composition of the second semiconductor layer is ZnCdS or ZnCdSe; or, the metal element $M^3$ is In, the metal element $M^4$ is Cd, and the composition of the second semiconductor layer is GaInP; or, the metal element $M^3$ is Cd, the metal element $M^4$ is Zn, and the composition of the second semiconductor layer is ZnCdS or ZnCdSe.

28. A semiconductor device, comprising:
a quantum dot including:
    a quantum dot core;
    a first semiconductor shell layer covering the quantum dot core; and
    a second semiconductor shell layer formed between the quantum dot core and the first semiconductor shell layer, the second semiconductor shell layer covering the quantum dot core, and the first semiconductor shell layer covering the second semiconductor shell layer;
the quantum dot core being composed of a metal element $M^1$, a metal element $M^2$, and a non-metal element; and
in the quantum dot core, along a radius direction of the quantum dot, the metal element $M^2$ increasing from inside to outside, and the metal element $M^1$ decreasing from inside to outside.

* * * * *